United States Patent
Shinohara et al.

(10) Patent No.: US 12,036,583 B2
(45) Date of Patent: Jul. 16, 2024

(54) SUBSTRATE CLEANING DEVICE AND SUBSTRATE CLEANING METHOD

(71) Applicant: SCREEN HOLDINGS CO., LTD., Kyoto (JP)

(72) Inventors: Tomoyuki Shinohara, Kyoto (JP); Junichi Ishii, Kyoto (JP); Kazuki Nakamura, Kyoto (JP); Yoshifumi Okada, Kyoto (JP); Takuma Takahashi, Kyoto (JP); Takashi Shinohara, Kyoto (JP); Nobuaki Okita, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 0 days.

(21) Appl. No.: 17/854,179

(22) Filed: Jun. 30, 2022

(65) Prior Publication Data
US 2023/0001456 A1    Jan. 5, 2023

(30) Foreign Application Priority Data
Jul. 5, 2021    (JP) .................................. 2021-111824

(51) Int. Cl.
*B08B 13/00*    (2006.01)
*B08B 1/20*    (2024.01)
(Continued)

(52) U.S. Cl.
CPC ................ *B08B 1/20* (2024.01); *B08B 3/022* (2013.01); *H01L 21/67051* (2013.01); *H01L 21/68764* (2013.01)

(58) Field of Classification Search
None
See application file for complete search history.

(56) References Cited

U.S. PATENT DOCUMENTS 6,151,744 A    11/2000    Ohtani ........................... 15/88.2
8,166,985 B2    5/2012    Nishiyama et al. .......... 134/137
(Continued)

FOREIGN PATENT DOCUMENTS

JP    3393016 B2    4/2003
JP    2015-023248 A    2/2015
(Continued)

OTHER PUBLICATIONS

Office Action dated May 5, 2023 issued in corresponding Taiwanese Patent Application No. 111120577, 10 pages.
(Continued)

*Primary Examiner* — Eric W Golightly
(74) *Attorney, Agent, or Firm* — OSTROLENK FABER LLP

(57) ABSTRACT

A cleaner comes into contact with a lower-surface center region of a substrate held by a first holder, so that the lower-surface center region is cleaned. The cleaner comes into contact with a lower-surface outer region of the substrate rotated by a second holder, so that the lower-surface outer region of the substrate is cleaned. During cleaning of the lower-surface center region, the second holder is rotated about a vertical axis while not holding the substrate. Alternatively, during cleaning of the lower-surface center region, the gas injector arranged between the cleaner and the second holder injects gas toward the substrate from a first height spaced apart from the substrate by a predetermined distance. Further, during drying of the lower-surface center region, the gas injector injects gas toward the substrate from a second height closer to the substrate than the first height.

5 Claims, 17 Drawing Sheets

(51) Int. Cl.
*B08B 3/02* (2006.01)
*H01L 21/67* (2006.01)
*H01L 21/687* (2006.01)

(56) References Cited

U.S. PATENT DOCUMENTS

| | | | |
|---|---|---|---|
| 2014/0041685 A1 | 2/2014 | Kaneko et al. | 134/4 |
| 2014/0144465 A1 | 5/2014 | Kaneko et al. | 134/4 |
| 2015/0027492 A1 | 1/2015 | Takiguchi et al. | 134/6 |
| 2016/0163534 A1 | 6/2016 | Kaneko et al. | |
| 2016/0236239 A1 | 8/2016 | Nishiyama | |
| 2017/0221696 A1 | 8/2017 | Nishiyama | |
| 2019/0214245 A1 | 7/2019 | Nishiyama | |
| 2021/0210338 A1 | 7/2021 | Nishiyama | |
| 2022/0410219 A1* | 12/2022 | Shinohara | H01L 21/68707 |

FOREIGN PATENT DOCUMENTS

| | | |
|---|---|---|
| JP | 5904169 B2 | 4/2016 |
| JP | 2021-052162 A | 4/2021 |
| KR | 10-1760552 B1 | 7/2017 |
| KR | 10-1798320 B1 | 11/2017 |
| KR | 10-2020-0133868 A | 12/2020 |

OTHER PUBLICATIONS

Office Action dated Nov. 27, 2023 in corresponding Korean Patent Application No. 10-2022-0080254, 5 pages, not in English.
Notice of Allowance dated May 20, 2024 in counterpart Korean Patent Application No. 10-2022-0080254, 3 pages, not in English.

* cited by examiner

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

SUBSTRATE CLEANING DEVICE AND SUBSTRATE CLEANING METHOD

BACKGROUND

Technical Field

The present invention relates to a substrate cleaning device and a substrate cleaning method for cleaning a substrate.

Description of Related Art

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, a substrate cleaning device described in JP 5904169 B2 includes two suction pads for holding a back-surface peripheral portion of a wafer, a spin chuck for holding a back-surface center portion of the wafer and a brush for cleaning the back surface of the wafer. The two suction pads hold the wafer and move in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

SUMMARY

In a substrate cleaning device described in JP 5904169 B2, the back surface of a wafer is dried by an air knife when the wafer is received from and transferred to a spin chuck, so that the surface of the spin chuck and the back surface of the wafer come into contact with each other while being dry. However, it is not easy to sufficiently prevent the cleaning liquid from adhering to the surface of the spin chuck. When the contaminated cleaning liquid adheres to the surface of the spin chuck, the cleanliness of the spin chuck is degraded. Therefore, it is required to keep the spin chuck clean.

An object of the present invention is to provide a substrate cleaning device and a substrate cleaning method that enable maintenance of a holder of a substrate clean.

(1) A substrate cleaning device according to a first invention includes a first holder that has a reference position and holds a substrate such that a center of the substrate is located at the reference position, a second holder that is configured to be rotatable about a vertical axis and holds a lower-surface center region of the substrate, a cleaner that cleans the lower-surface center region by coming into contact with the lower-surface center region of the substrate held by the first holder and cleans a lower-surface outer region by coming into contact with the lower-surface outer region surrounding the lower-surface center region of the substrate rotated by the second holder, and a mobile base that is provided with the second holder and the cleaner, moves in a horizontal plane such that the second holder overlaps with the reference position of the first holder in a plan view when the substrate is received and transferred between the first holder and the second holder, and moves in a horizontal plane such that the cleaner overlaps with the reference position of the first holder in the plan view when the lower-surface center region is cleaned, wherein the second holder rotates while not holding the substrate during cleaning of the lower-surface center region.

In the substrate cleaning device according to this invention, the cleaner comes into contact with the lower-surface center region of the substrate with the substrate being held by the first holder such that the center of the substrate is located at the reference position during cleaning of the lower-surface center region of the substrate. Further, the second holder is rotated about the vertical axis while not holding the substrate. During cleaning of the lower-surface outer region of the substrate, the cleaner comes into contact with the lower-surface outer region of the substrate with the substrate rotated about a vertical axis while the lower-surface center region of the substrate is held by the second holder.

The second holder and the cleaner are provided at the mobile base. When the substrate is received and transferred between the first holder and the second holder, the mobile base is moved in a horizontal plane such that the second holder overlaps with the reference position of the first holder in a plan view. During cleaning of the lower-surface center region, the mobile base is moved in a horizontal plane such that the cleaner overlaps with the reference position of the first holder in a plan view.

With this configuration, during cleaning of the lower-surface center region of the substrate, the second holder is retreated to a position not overlapping with the substrate. Further, even in a case in which the liquid that includes contaminants and has splashed from the substrate adheres to the second holder, the liquid is shaken off from the second holder by the rotation of the second holder. Thus, the second holder can be kept clean.

(2) The substrate cleaning device may further include a gas injector that is arranged between the cleaner and the second holder and injects gas toward the substrate. In this case, it is possible to prevent the liquid including contaminants from being splashed from the substrate toward the second holder using the gas injected from the gas injector during cleaning of the lower-surface center region. Further, the lower-surface center region can be efficiently dried by the gas injected from the gas injector. Thus, the liquid can be prevented from adhering to the second holder, and the second holder can be kept clean.

(3) The substrate cleaning device may further include a linear guide that extends in one direction in the horizontal plane, wherein the mobile base may move linearly along the linear guide. In this case, the mobile base can be moved in a horizontal plane with a simple configuration.

(4) A rotation speed of the second holder during cleaning of the lower-surface center region may be equal to or higher than 500 rpm. In this case, the liquid adhering to the second holder is shaken off from the second holder in a short period of time. Thus, the second holder can be kept clean more efficiently.

(5) A substrate cleaning device according to a second invention includes a first holder that holds a substrate, a second holder that rotates the substrate about a vertical axis while holding a lower-surface center region of the substrate, a cleaner that cleans the lower-surface center region by coming into contact with the lower-surface center region of the substrate held by the first holder and cleans a lower-surface outer region by coming into contact with the lower-surface outer region surrounding the lower-surface center region of the substrate rotated by the second holder, and a gas injector that is arranged to be movable upwardly and downwardly between the cleaner and the second holder, injects gas toward the substrate from a first height spaced apart from the substrate by a predetermined distance during cleaning of the lower-surface center region and injects gas toward the substrate from a second height closer to the substrate than the first height during drying of the lower-surface center region.

In this substrate cleaning device, when the lower-surface center region of the substrate is cleaned, the cleaner comes into contact with the lower-surface center region of the substrate with the substrate held by the first holder. During cleaning of the lower-surface center region, the gas injector arranged between the cleaner and the second holder injects gas from the first height spaced apart from the substrate by the predetermined distance toward the substrate. During drying of the lower-surface center region, the gas injector injects gas toward the substrate from a second height closer to the substrate than the first height.

With this configuration, during cleaning of the lower-surface center region, the gas injected from the gas injector prevents the liquid including contaminants from being splashed from the substrate toward the second holder. Further, during drying of the lower-surface center region, gas is injected from the gas injector to the lower surface of the substrate with the lower surface of the substrate and the gas injector being close to each other. Thus, the lower-surface center region is efficiently dried. Therefore, the liquid is prevented from adhering to the second holder. Thus, the second holder can be kept clean.

(6) The second holder may rotate while not holding the substrate during cleaning of the lower-surface center region. With this configuration, even in a case in which the liquid including contaminants that have splashed from the substrate adheres to the second holder, the liquid is shaken off from the second holder by the rotation of the second holder. Thus, the second holder can be kept clean more reliably.

(7) The substrate cleaning device may further include a common supporter that supports the cleaner and the gas injector. In this case, the cleaner and the gas injector are moved integrally in accordance with the position of the substrate. Thus, the lower surface of the substrate can be cleaned efficiently. Further, because the gas injector is provided to be movable upwardly and downwardly, even in a case in which the cleaner and the gas injector are supported by the common supporter, the gas injector can be close to the substrate when the lower-surface center region of the substrate is dried as compared to the time when the lower-surface center region of the substrate is cleaned.

Thus, the lower surface of the substrate can be dried efficiently.

(8) A substrate cleaning method according to a third invention includes holding a substrate using a first holder such that a center of the substrate is located at a reference position during cleaning of a lower-surface center region of the substrate, rotating a second holder about a vertical axis while not holding the substrate during cleaning of the lower-surface center region, causing a cleaner to come into contact with the lower-surface center region of the substrate held by the first holder during cleaning of the lower-surface center region, rotating the substrate about a vertical axis while holding the lower-surface center region of the substrate using the second holder during cleaning of a lower-surface outer region surrounding the lower-surface center region of the substrate, causing the cleaner to come into contact with the lower-surface outer region of the substrate rotated by the second holder during cleaning of the lower-surface outer region, and moving a mobile base provided with the second holder and the cleaner in a horizontal plane such that the second holder overlaps with the reference position of the first holder in a plan view when the substrate is received and transferred between the first holder and the second holder, and moving the mobile base such that the cleaner overlaps with the reference position of the first holder in the plan view during cleaning of the lower-surface center region.

With this substrate cleaning method, during cleaning of the lower-surface center region of the substrate, the second holder is retreated to a position not overlapping with the substrate. Further, even in a case in which the liquid that includes contaminants and has splashed from the substrate adheres to the second holder, the liquid is shaken off from the second holder by the rotation of the second holder. Thus, the second holder can be kept clean.

(9) The substrate cleaning method may further include injecting gas toward the substrate using a gas injector provided between the cleaner and the second holder. In this case, it is possible to prevent the liquid including contaminants from being splashed from the substrate toward the second holder using the gas injected from the gas injector during cleaning of the lower-surface center region. Further, the lower-surface center region can be efficiently dried by the gas injected from the gas injector. Thus, the liquid can be prevented from adhering to the second holder, and the second holder can be kept clean.

(10) The moving a mobile base in a horizontal plane may include moving the mobile base linearly along a linear guide extending in one direction in the horizontal plane. In this case, the mobile base can be moved in a horizontal plane with a simple configuration.

(11) The rotating a second holder about a vertical axis while not holding the substrate may include rotating the second holder at a rotation speed equal to or higher than 500 rpm. In this case, the liquid adhering to the second holder is shaken off from the second holder in a short period of time. Thus, the second holder can be kept clean more efficiently.

(12) A substrate cleaning method according to a fourth invention includes holding a substrate using a first holder during cleaning of a lower-surface center region of the substrate, causing a cleaner to come into contact with the lower-surface center region of the substrate held by the first holder during cleaning of the lower-surface center region, rotating the substrate about a vertical axis while holding the lower-surface center region of the substrate using a second holder during cleaning of a lower-surface outer region surrounding the lower-surface center region of the substrate, causing the cleaner to come into contact with the lower-surface outer region of the substrate rotated by the second holder during cleaning of the lower-surface outer region, and injecting gas toward the substrate from a first height spaced apart from the substrate by a predetermined distance using a gas injector arranged between the cleaner and the second holder during cleaning of the lower-surface center region, and injecting gas toward the substrate from a second height closer to the substrate than the first height using the gas injector during drying of the lower-surface outer region.

With this substrate cleaning method, during cleaning of the lower-surface center region, the gas injected from the gas injector prevents the liquid including contaminants from being splashed from the substrate toward the second holder. Further, when the lower-surface center region is dried, gas is injected from the gas injector to the lower surface of the substrate with the lower surface of the substrate and the gas injector being close to each other. Thus, the lower-surface center region is efficiently dried. Therefore, the liquid is prevented from adhering to the second holder. Thus, the second holder can be kept clean.

(13) The substrate cleaning method may further include rotating the second holder about a vertical axis while not holding the substrate during cleaning of the lower-surface center region. With this configuration, even in a case in which the liquid including contaminants that have splashed from the substrate adheres to the second holder, the liquid is shaken off from the second holder by the rotation of the second holder. Thus, the second holder can be kept clean more reliably.

(14) The cleaner and the gas injector may be supported by a common supporter. In this case, the cleaner and the gas injector are moved integrally in accordance with the position of the substrate. Thus, the lower surface of the substrate can be cleaned efficiently. Further, because the gas injector is provided to be movable upwardly and downwardly, even in a case in which the cleaner and the gas injector are supported by the common supporter, the gas injector can be close to the substrate when the lower-surface center region of the substrate is dried as compared to the time when the lower-surface center region of the substrate is cleaned. Thus, the lower surface of the substrate can be dried efficiently.

Other features, elements, characteristics, and advantages of the present disclosure will become more apparent from the following description of preferred embodiments of the present disclosure with reference to the attached drawings.

DETAILED DESCRIPTION

A substrate cleaning device according to embodiments of the present invention will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like. Further, as for a substrate to be used in the present embodiment, at least part of the substrate has a circular outer periphery. For example, the outer periphery except for a notch for positioning is circular.

(1) Configuration of Substrate Processing Apparatus

Figure 1:
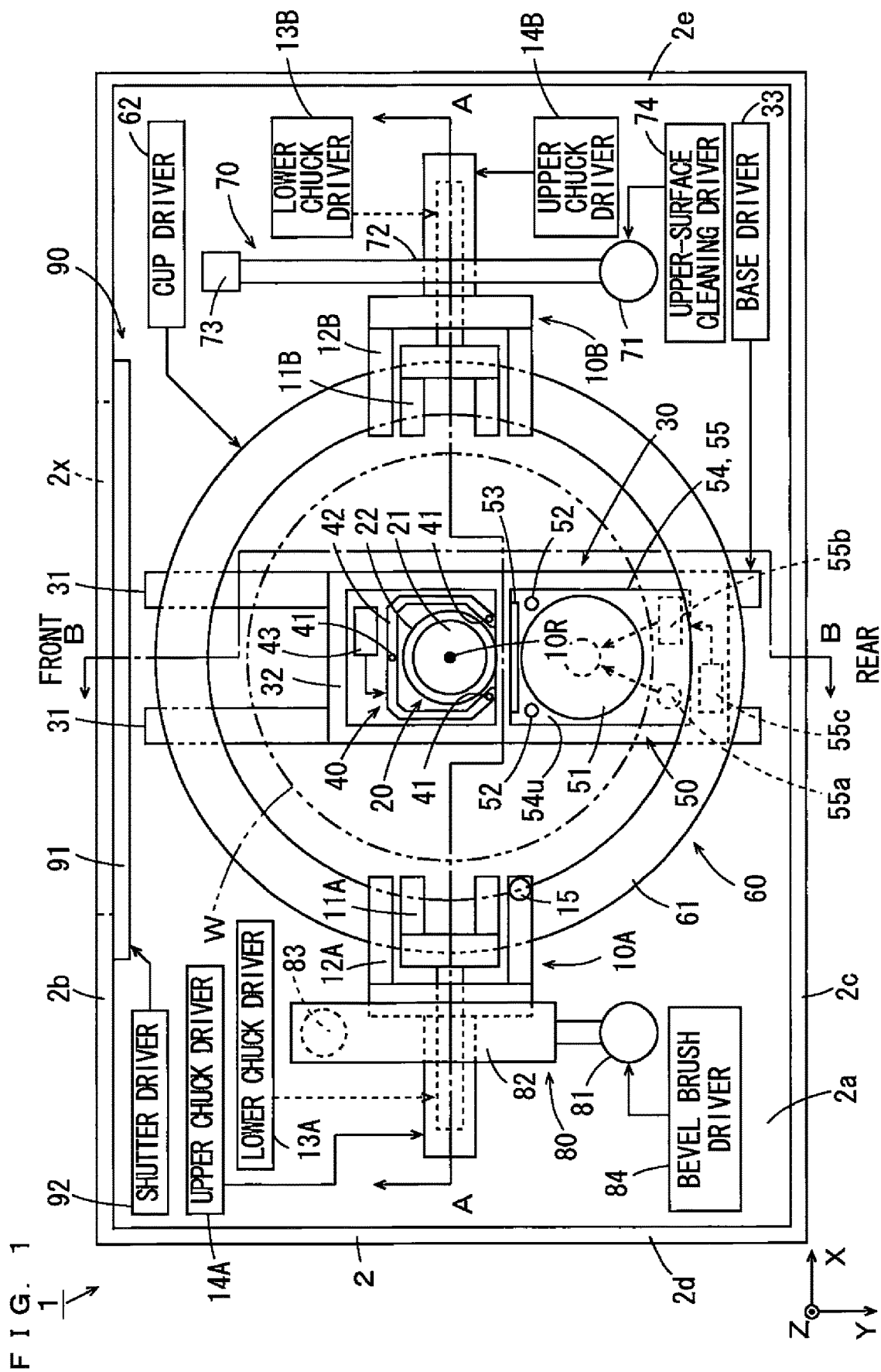
FIG. 1 is a schematic plan view of a substrate cleaning device according to one embodiment of the present invention.
Figure 2:
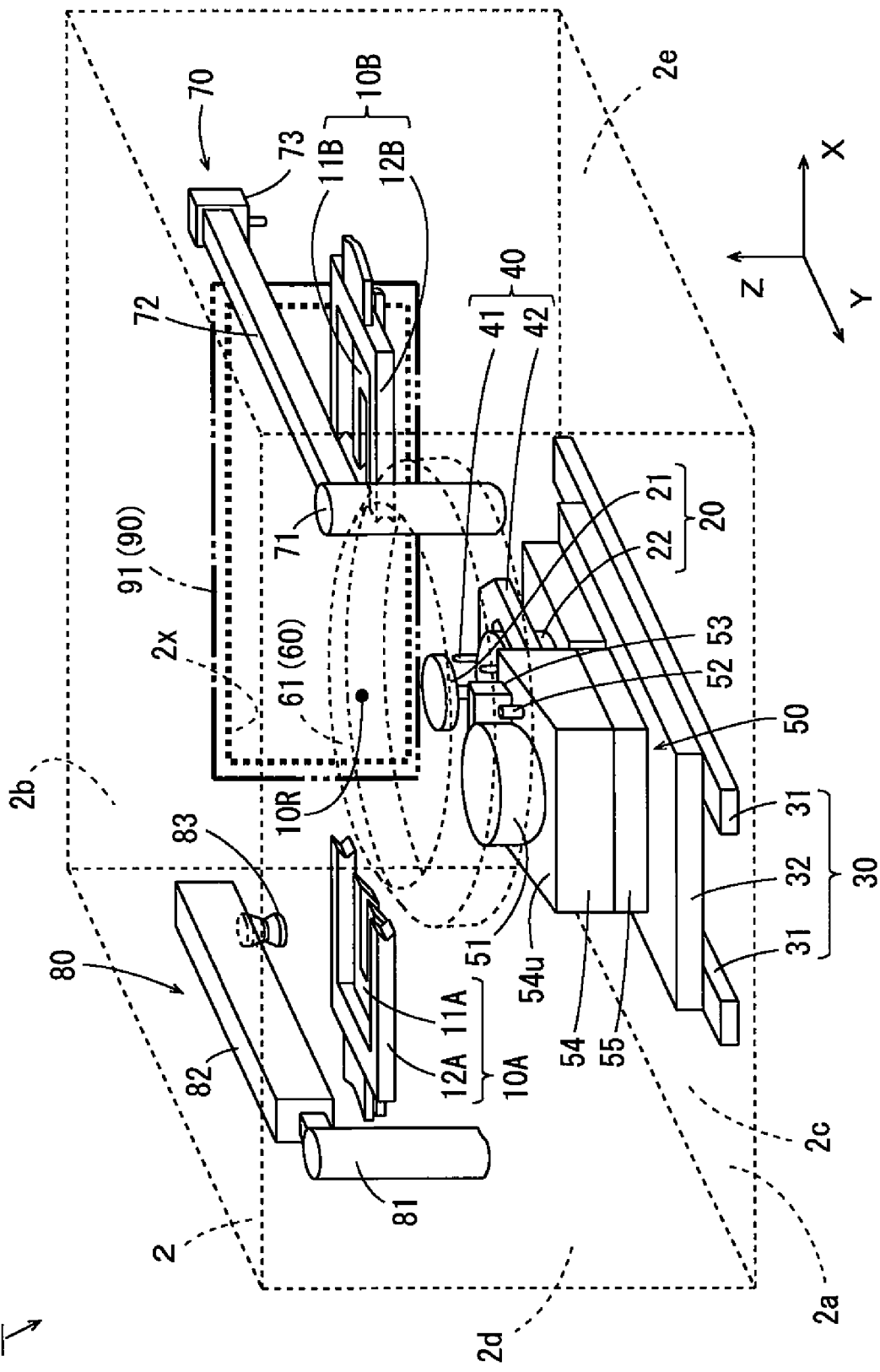
FIG. 2 is an external perspective view showing the inner configuration of the substrate cleaning device of FIG. 1.

FIG. 1 is a schematic plan view of a substrate cleaning device according to one embodiment of the present invention. FIG. 2 is an external perspective view showing the inner configuration of the substrate cleaning device 1 of FIG. 1. In the substrate cleaning device 1 according to the present embodiment, X, Y and Z directions orthogonal to one another are defined for the clarity of a positional relationship. In FIG. 1 and the subsequent drawings, the X, Y and Z directions are suitably indicated by arrows. The X and Y directions are orthogonal to each other within a horizontal plane, and the Z direction corresponds to a vertical direction.

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from four sides of the bottom surface portion 2a. The sidewall portions 2b, 2c are opposite to each other, and the sidewall portions 2d, 2e are opposite to each other. A rectangular opening is formed in the center portion of the sidewall portion 2b. This opening is an inlet-outlet port 2x for a substrate W and is used when the substrate W is carried into and carried out from the unit casing 2. In FIG. 2, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

An opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 to open the inlet-outlet port 2x when a substrate W is carried into and carried out from the substrate cleaning device 1. Further, the shutter driver 92 drives the shutter 91 to close the inlet-outlet port 2x when a substrate W is cleaned in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in a plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of a substrate W by suction and is configured to be rotatable about an axis extending in the up-and-down direction (the axis extending in the Z direction). In the following description, a region that is to be sucked by the suction surface of the suction holder 21 in the lower surface of a substrate W when the substrate W is held by suction by the suction holder 21 is referred to as a lower-surface center region. On the other hand, a region, surrounding the lower-surface center region, in the lower surface of a substrate W is referred to as a lower-surface outer region.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding a substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in a plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts or lowers the pin coupling member 42 on the mobile base 32. Thus, the plurality of support pins 41 are lifted or lowered relative to the suction holder 21.

The lower-surface cleaning device 50 includes a lower-surface brush 51, two liquid nozzles 52, a gas injector 53, a lifting-lowering supporter 54, a movement supporter 55, a lower-surface brush rotation driver 55a, a lower-surface brush lifting-lowering driver 55b, a lower-surface brush movement driver 55c and a gas lifting-lowering driver 55d. The movement supporter 55 is provided to be movable in the Y direction with respect to the lower holding device 20 in a certain region on the mobile base 32. As shown in FIG. 2, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 has a circular outer shape in a plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 is larger than ⅓ of the diameter of a substrate W and smaller than ½ of the diameter of a substrate W. The diameter of a substrate W is 300 mm, for example.

The lower-surface brush 51 has a cleaning surface that can come into contact with the lower surface of a substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface.

Each of the two liquid nozzles 52 is attached to the upper surface 54u of the lifting-lowering supporter 54 to be located in the vicinity of the lower-surface brush 51. Further, each of the two liquid nozzles 52 is attached to the upper surface 54u such that a liquid discharge port is directed upwardly. A lower-surface cleaning liquid supplier 56 (FIG. 3) is connected to the liquid nozzles 52. The lower-surface cleaning liquid supplier 56 supplies a cleaning liquid to the liquid nozzles 52. When a substrate W is cleaned by the lower-surface brush 51, the liquid nozzles 52 discharge the cleaning liquid supplied from the lower-surface cleaning liquid supplier 56 to the lower surface of the substrate W. In the present embodiment, pure water is used as the cleaning liquid to be supplied to the liquid nozzles 52.

The gas injector 53 is a slit-like gas injection nozzle having a gas injection port extending in one direction. The gas injector 53 is attached to the upper surface 54u of the lifting-lowering supporter 54 to be located between the lower-surface brush 51 and the suction holder 21 in a plan view. Further, the gas injector 53 is attached to the upper surface 54u of the lifting-lowering supporter 54 such that a gas injection port is directed upwardly. An injection gas supplier 57 (FIG. 3) is connected to the gas injector 53. The injection gas supplier 57 supplies gas to the gas injector 53.

In the present embodiment, an inert gas such as a nitrogen gas is used as the gas to be supplied to the gas injector 53. Gas supplied to the gas injector 53 may be another gas such as clean dry air (CDA). The gas injector 53 injects the gas supplied from the injection gas supplier 57 to the lower surface of a substrate W when the substrate W is cleaned by the lower-surface brush 51 and when the lower surface of a substrate W is dried, as described below. In this case, a strip-shaped gas curtain extending in the X direction is formed between the lower-surface brush 51 and the suction holder 21.

The lower-surface brush rotation driver 55a includes a motor, and rotates the lower-surface brush 51 when a substrate W is cleaned by the lower-surface brush 51. The lower-surface brush lifting-lowering driver 55b includes a stepping motor or an air cylinder, and lifts or lowers the lifting-lowering supporter 54 with respect to the movement supporter 55. The lower-surface brush movement driver 55c includes a motor, and moves the movement supporter 55 in the Y direction on the mobile base 32. Here, the position of the lower holding device 20 in the mobile base 32 is fixed. Therefore, when being moved by the lower-surface brush movement driver 55c in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position. The gas lifting-lowering driver 55d includes a stepping motor or an air cylinder, and lifts and lowers the gas injector 53 on the lifting-lowering supporter 54.

The cup device 60 is further provided in the center portion of the bottom surface portion 2a. The cup device 60 includes a cup 61 and a cup driver 62. The cup 61 is provided to surround the lower holding device 20 and the base device 30 in a plan view, and be liftable and lowerable. In FIG. 2, the cup 61 is indicated by the dotted lines. The cup driver 62 moves the cup 61 between a lower cup position and an upper cup position in accordance with which portion of the lower surface of a substrate W is to be cleaned by the lower-surface brush 51. The lower cup position is a height position at which the upper end portion of the cup 61 is located farther downwardly than a substrate W held by suction by the suction holder 21. Further, the upper cup position is a height position at which the upper end portion of the cup 61 is located farther upwardly than the suction holder 21.

At height positions farther upward than the cup 61, the pair of upper holding devices 10A, 10B is provided to be opposite to each other with the base device 30 held therebetween in a plan view. The upper holding devices 10A, 10B have a reference position 10R. The upper holding devices 10A, 10B hold a substrate W such that the center of the substrate W is located at the reference position 10R. Specifically, the upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (the front-and-rear direction) through the center of the suction holder 21 in a plan view, and are provided to be movable in the X direction in a common horizontal plane. Each of the lower chucks 11A, 11B has two support pieces that can support a lower-surface peripheral portion of a substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the front-and-rear direction) through the center of the suction holder 21 in a plan view, and are provided to be movable in the X direction in a common horizontal plane. Each of the upper chucks 12A, 12B has two holding pieces that are configured to abut against two portions of the outer peripheral end of a substrate W and be capable of holding the outer peripheral end of the substrate W. The upper chuck drivers 14A, 14B move the upper chucks 12A, 12B such that the upper chucks 12A, 12B are closer to each other or farther away from each other.

As shown in FIG. 1, at a position near one side of the cup 61, the upper-surface cleaning device 70 is provided to be located in the vicinity of the upper holding device 10B in a plan view. The upper-surface cleaning device 70 includes a rotation support shaft 71, an arm 72, a spray nozzle 73 and an upper-surface cleaning driver 74.

The rotation support shaft 71 is supported on the bottom surface portion 2a by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 3) is connected to the spray nozzle 73. The upper-surface cleaning fluid supplier 75 supplies the cleaning liquid and gas to the spray nozzle 73. In the present embodiment, pure water is used as the cleaning liquid to be supplied to the spray nozzle 73, and an inert gas such as a nitrogen gas is used as the gas to be supplied to the spray nozzle 73. When the upper surface of a substrate W is cleaned, the spray nozzle 73 mixes the cleaning liquid and the gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts or lowers the rotation support shaft 71, and rotates the rotation support shaft 71. With the above-mentioned configuration, on the upper surface of a substrate W held by suction and rotated by the suction holder 21, the spray nozzle 3 is moved in a circular arc shape. Thus, the entire upper surface of the substrate W can be cleaned.

As shown in FIG. 1, at a position near the other side of the cup 61, the end-portion cleaning device 80 is provided to be located in the vicinity of the upper holding device 10A in a plan view. The end-portion cleaning device 80 includes a rotation support shaft 81, an arm 82, a bevel brush 83 and a bevel brush driver 84.

The rotation support shaft 81 is supported on the bottom surface portion 2a by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of a substrate W can be cleaned by the center portion in the up-and-down direction of the outer peripheral surface.

The bevel brush driver 84 includes one or a plurality of pulse motors, an air cylinder and the like, lifts or lowers the rotation support shaft 81 and rotates the rotation support shaft 81. With the above-mentioned configuration, the center portion of the outer peripheral surface of the bevel brush 83 is brought into contact with the outer peripheral end of a substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of a substrate W is cleaned, a cleaning force of the bevel brush 83 in the outer peripheral end of the substrate W is improved by rotation of the bevel brush 83.

Figure 3:
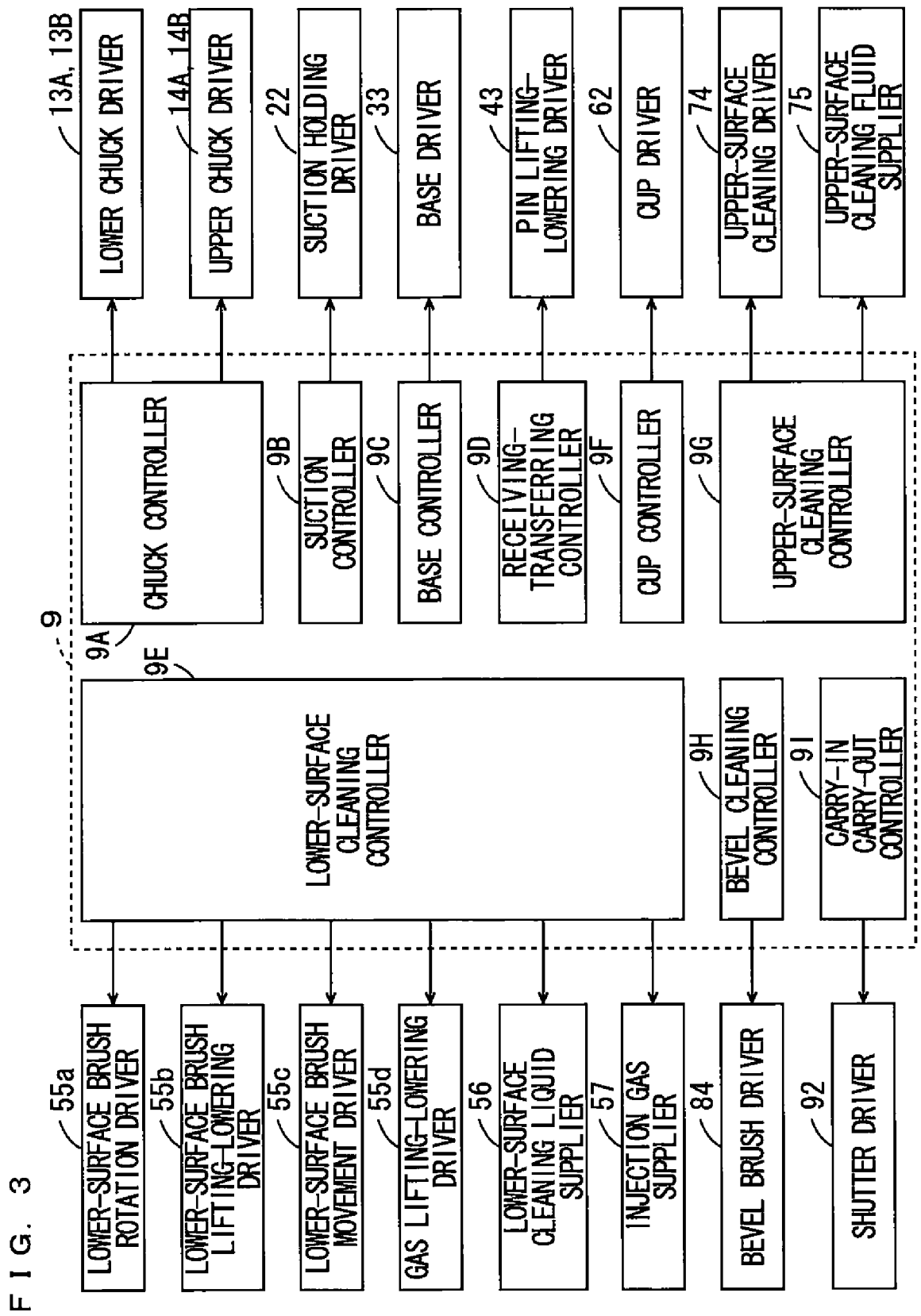
FIG. 3 is a block diagram showing the configuration of a control system of the substrate cleaning device.

FIG. 3 is a block diagram showing the configuration of a control system of the substrate cleaning device 1. A control device 9 of FIG. 3 includes a CPU (Central Processing Unit), a RAM (Random Access Memory), a ROM (Read Only Memory) and a storage device. The RAM is used as a work area for the CPU. The ROM stores a system program. The storage device stores a control program.

As shown in FIG. 3, the control device 9 includes a chuck controller 9A, a suction controller 9B, a base controller 9C, a receiving-transferring controller 9D, a lower-surface cleaning controller 9E, a cup controller 9F, an upper-surface cleaning controller 9G, a bevel cleaning controller 9H and a carry-in carry-out controller 9I as functions. The functions of the control device 9 are implemented by execution of a substrate cleaning program stored in the storage device by the CPU. Part or all of the functions of the control device 9 may be implemented by hardware such as an electronic circuit.

The chuck controller 9A controls the lower chuck drivers 13A, 13B and the upper chuck drivers 14A, 14B in order to receive a substrate W that is carried into the substrate cleaning device 1 and hold the substrate W at a position above the suction holder 1. The suction controller 9B controls the suction holding driver 22 in order to hold a substrate W by suction using the suction holder 21 and rotate the substrate W held by suction.

The base controller 9C controls the base driver 33 in order to move the mobile base 32 with respect to a substrate W held by the upper holding devices 10A, 10B. The receiving-transferring controller 9D controls the pin lifting-lowering driver 43 in order to move a substrate W between a height position of the substrate W held by the upper holding devices 10A, 10B and a height position of the substrate W held by the suction holder 21.

The lower-surface cleaning controller 9E controls the lower-surface brush rotation driver 55a, the lower-surface brush lifting-lowering driver 55b, the lower-surface brush movement driver 55c, the gas lifting-lowering driver 55d, the lower-surface cleaning liquid supplier 56 and the injection gas supplier 57 in order to clean the lower surface of a substrate W. The cup controller 9F controls the cup driver 62 in order to receive the cleaning liquid splashed from a substrate W using the cup 61 when the substrate W held by suction by the suction holder 21 is cleaned.

The upper-surface cleaning controller 9G controls the upper-surface cleaning driver 74 and the upper-surface cleaning fluid supplier 75 in order to clean the upper surface of a substrate W held by suction by the suction holder 21. The bevel cleaning controller 9H controls the bevel brush driver 84 in order to clean the outer peripheral end of a substrate W held by suction by the suction holder 21. The carry-in carry-out controller 9I controls the shutter driver 92 in order to open and close the inlet-outlet port 2x of the unit casing 2 when a substrate W is carried into and carried out from the substrate cleaning device 1.

(2) Schematic Operation of Substrate Cleaning Device

FIGS. 4 to 15 are schematic diagrams for explaining the schematic operation of the substrate cleaning device 1 of FIG. 1. In each of FIGS. 4 to 15, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 14 to 15, the cup 61 is indicated by the two-dots and dash lines, and the outer shape of a substrate W is indicated by the thick one-dot and dash lines.

In an initial state before a substrate W is carried into the substrate cleaning device 1, the inlet-outlet port 2x is closed by the shutter 91 of the opening-closing device 90. Further, as shown in FIG. 1, the lower chucks 11A, 11B are maintained in a state in which the distance between the lower chucks 11A, 11B is sufficiently larger than the diameter of a substrate W. Further, the upper chucks 12A, 12B are also maintained in a state in which the distance between the upper chucks 12A, 12B is sufficiently larger than the diameter of a substrate W. Further, the mobile base 32 of the base device 30 is arranged such that the center of the suction holder 21 is located at the center of the cup 61 in a plan view. The lower-surface cleaning device 50 is arranged in the proximal position on the mobile base 32. In the lifting-lowering supporter 54 of the lower-surface cleaning device 50, the cleaning surface (the upper end portion) of the lower-surface brush 51 is located farther downwardly than the suction holder 21.

Further, in the receiving-transferring device 40, the plurality of support pins 41 are located farther downwardly than the suction holder 21. Further, in the cup device 60, the cup 61 is in the lower cup position. In the following description, the center position of the cup 61 in a plan view is referred to as a plane reference position rp. Further, the position of the mobile base 32 located on the bottom surface portion 2a when the center of the suction holder 21 is in the plane reference position rp in a plan view is referred to as a first horizontal position.

Figure 4:
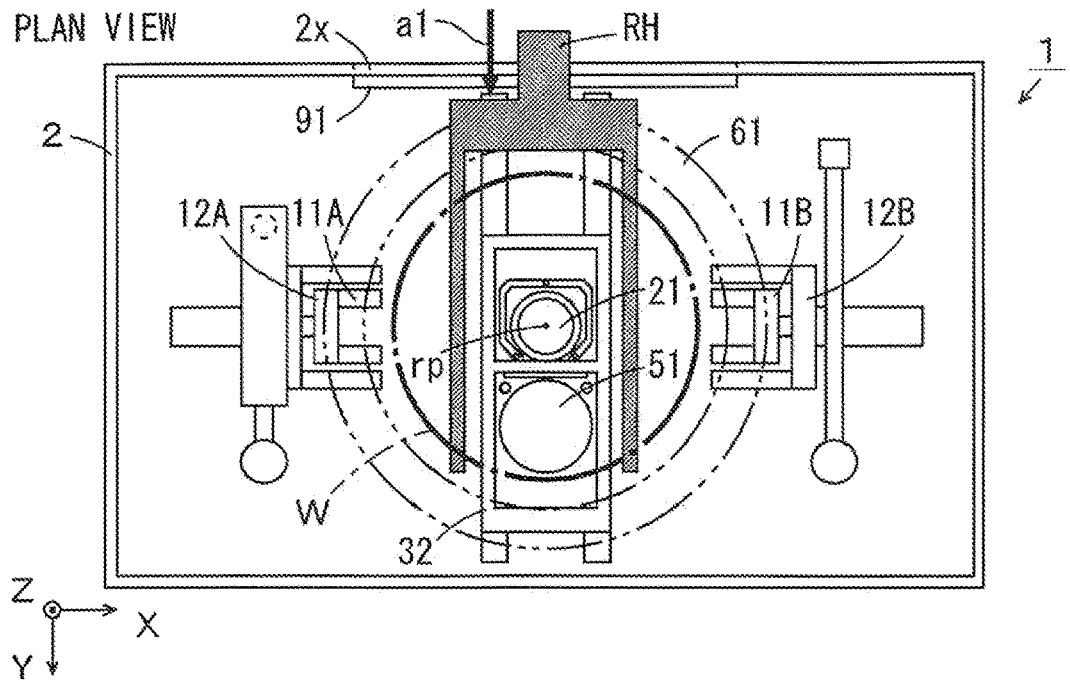
FIG. 4 is a schematic diagram for explaining the schematic operation of the substrate cleaning device of FIG. 1.
Figure 4:
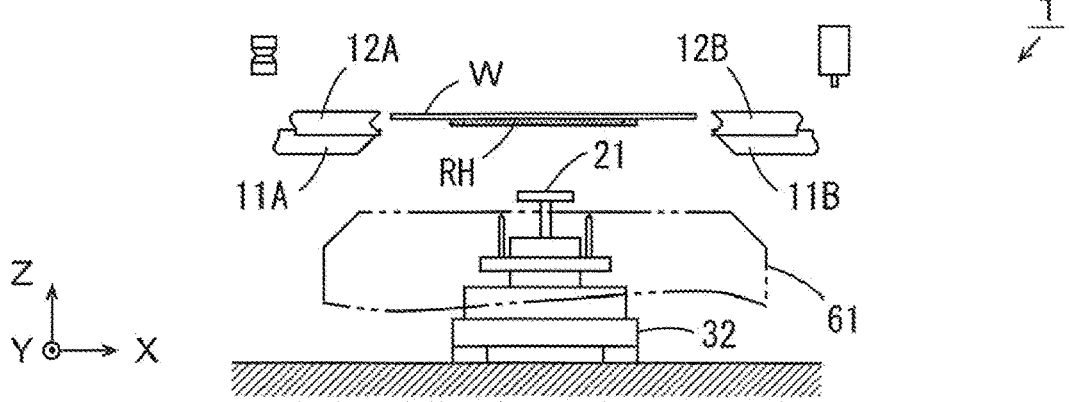
Figure 4:
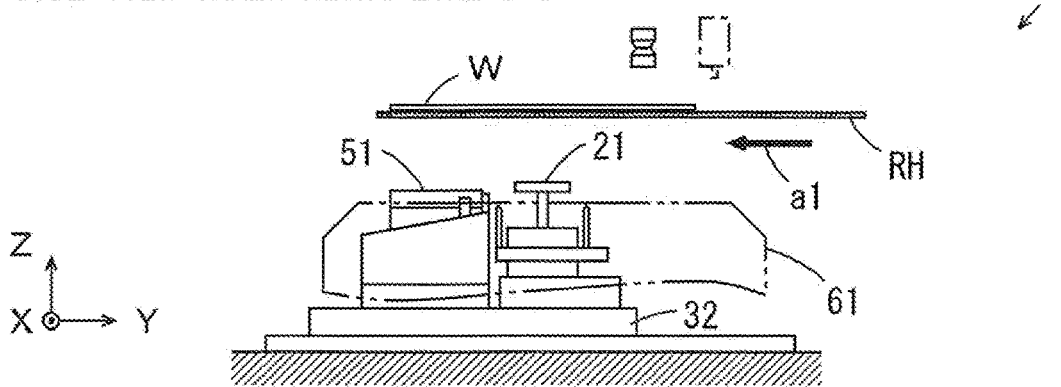

A substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 4, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 4.

Next, as indicated by the thick solid arrows a2 in FIG. 5, the lower chucks 11A, 11B move closer to each other such that a plurality of support pieces of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces of the lower chucks 11A, 11B. After the hand RH exits, the shutter 91 closes the inlet-outlet port 2x.

Figure 6:
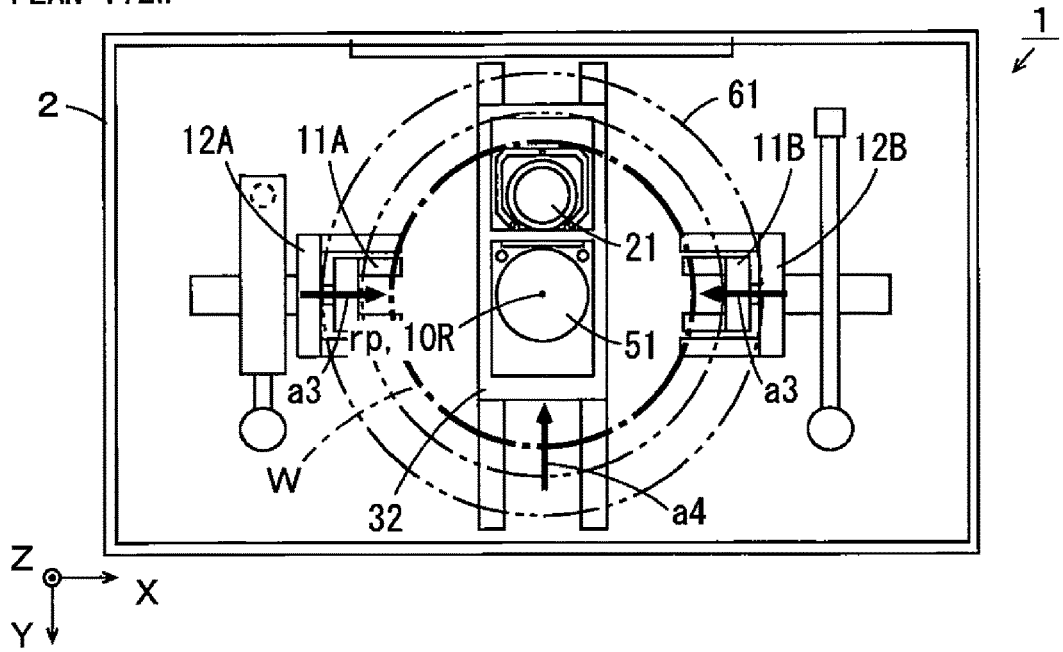
FIG. 6 is a schematic diagram for explaining the schematic operation of the substrate cleaning device of FIG. 1.
Figure 6:
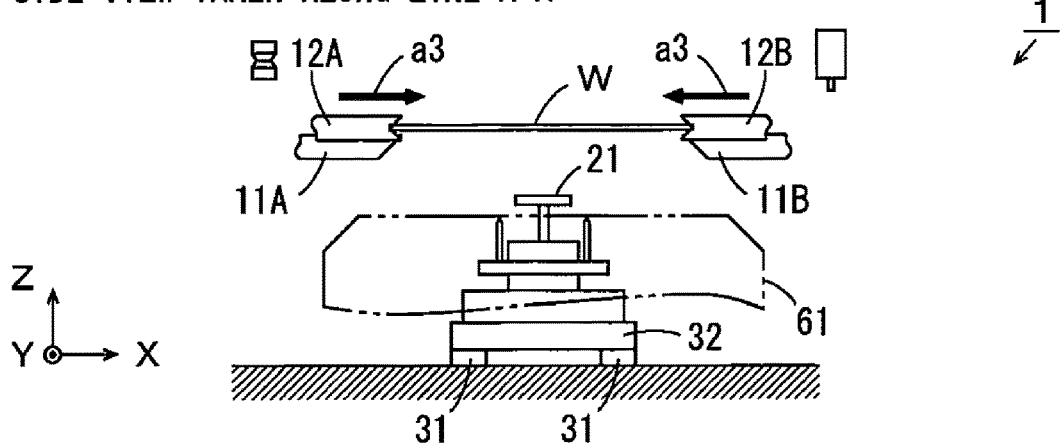
Figure 6:
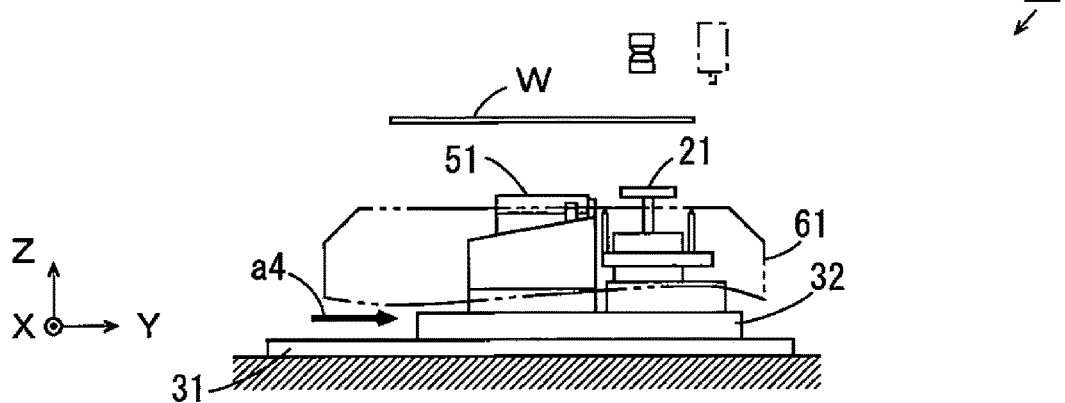

Next, as indicated by the thick solid arrows a3 in FIG. 6, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B.

Further, as indicated by the thick solid arrow a4 in FIG. 6, the mobile base 32 is moved forwardly from the first horizontal position such that suction holder 21 deviates from the plane reference position rp by a predetermined distance and the center of the lower-surface brush 51 is located at the plane reference position rp. In this case, the lower-surface brush 51 overlaps with the reference position 1 OR of the upper holding devices 10A, 10B in a plan view. At this time, the position of the mobile base 32 located on the bottom surface portion 2a is referred to as a second horizontal position.

Figure 7:
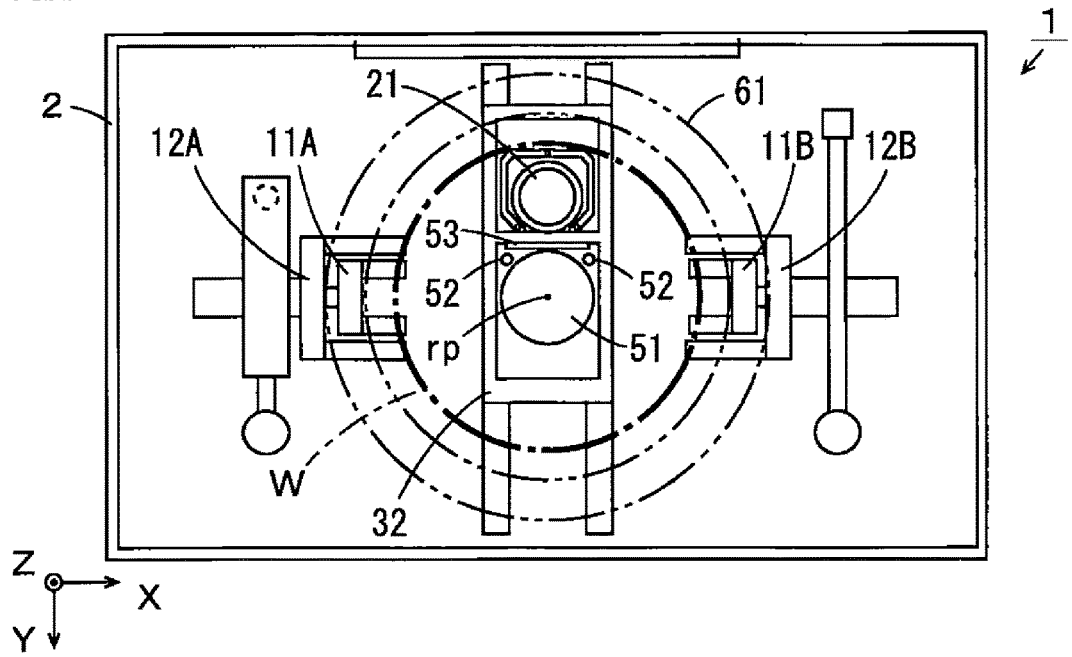
FIG. 7 is a schematic diagram for explaining the schematic operation of the substrate cleaning device of FIG. 1.
Figure 7:
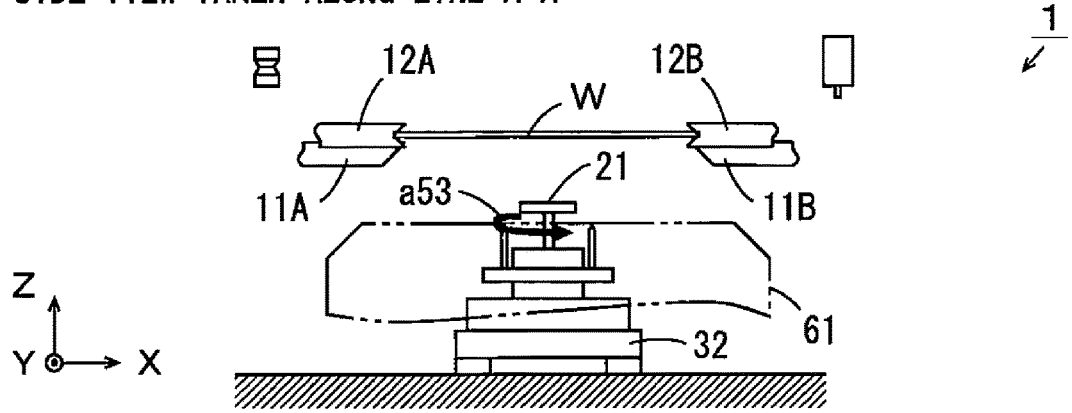
Figure 7:
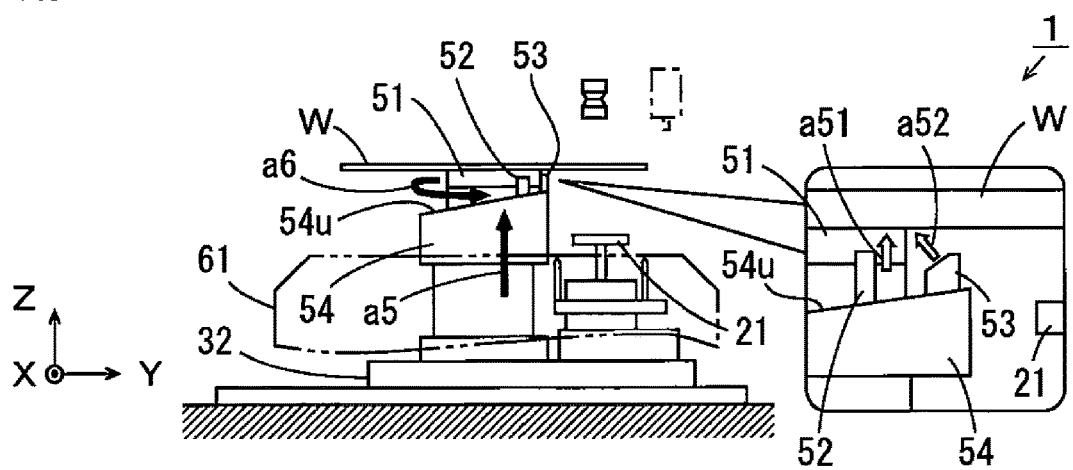

Next, as indicated by the thick solid arrow a5 in FIG. 7, the lifting-lowering supporter 54 is lifted such that the cleaning surface of the lower-surface brush 51 comes into contact with the lower-surface center region of the substrate W. Further, as indicated by the thick solid arrow a6 in FIG. 7, the lower-surface brush 51 is rotated (spins) about the center axis 51c. Thus, contaminants adhering to the lower-surface center region of the substrate W are physically stripped by the lower-surface brush 51.

In the bottom field in FIG. 7, an enlarged side view of a portion in which the lower-surface brush 51 come into contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to the contact portion in which the lower-surface brush 51 and the substrate W are in contact with each other, whereby contaminants that have been removed from the back surface of the substrate W by the lower-surface brush 51 are washed away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

Here, the upper surface 54u of the lifting-lowering supporter 54 is inclined downwardly in a direction away from the suction holder 21. In this case, in a case in which the cleaning liquid including contaminants falls on the lifting-lowering supporter 54 from the lower surface of the substrate W, the cleaning liquid received by the upper surface 54u is guided in a direction away from the suction holder 21.

When the lower-surface center region of the substrate W is cleaned by the lower-surface brush 51, the height of the upper end of the gas injector 53 is spaced apart from the substrate W by a predetermined distance. The height of the upper end of the gas injector 53 at this time is referred to as a first height. As indicated by the outline arrow a52 in the balloon of FIG. 7, the gas injector 53 injects gas toward the lower surface of the substrate W from the first height at a position between the lower-surface brush 51 and the suction holder 21.

In the present embodiment, the gas injector 53 is attached onto the lifting-lowering supporter 54 such that the gas injection port extends in the X direction. In this case, when gas is injected to the lower surface of the substrate W from the gas injector 53, a strip-shaped curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower-surface center region of the substrate W is cleaned by the lower-surface brush 51, the cleaning liquid including contaminants is prevented from adhering to the suction holder 21, and the suction surface of the suction holder 21 is kept clean.

While the gas injector 53 injects gas obliquely upwardly toward the lower-surface brush 51 from the gas injector 53 as indicated by the outlined arrow a52 in the example of FIG. 7, the present invention is not limited to this. The gas injector 53 may inject gas in the Z direction toward the lower surface of the substrate W from the gas injector 53.

Further, as indicated by the thick solid arrow a53 in FIG. 7, when the lower-surface center region of the substrate W is cleaned by the lower-surface brush 51, the suction holder 21 rotates while not holding the substrate W. The rotation speed of the suction holder 21 at this time is equal to or higher than 500 rpm, for example. In this case, when the lower-surface center region of the substrate W is cleaned, even in a case in which the cleaning liquid including splashed contaminants adheres to the suction holder 21, the cleaning liquid is shaken off from the suction holder 21. Thus, the suction surface of the suction holder 21 is kept clean.

Next, in the state shown in FIG. 7, when the cleaning of the lower-surface center region of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance. Further, discharging of the cleaning liquid from the liquid nozzle 52 to the substrate W is stopped, and the rotation of the suction holder 21 is stopped. On the other hand, as shown in FIG. 8, injection of gas from the gas injector 53 to the substrate W is continued.

Figure 8:
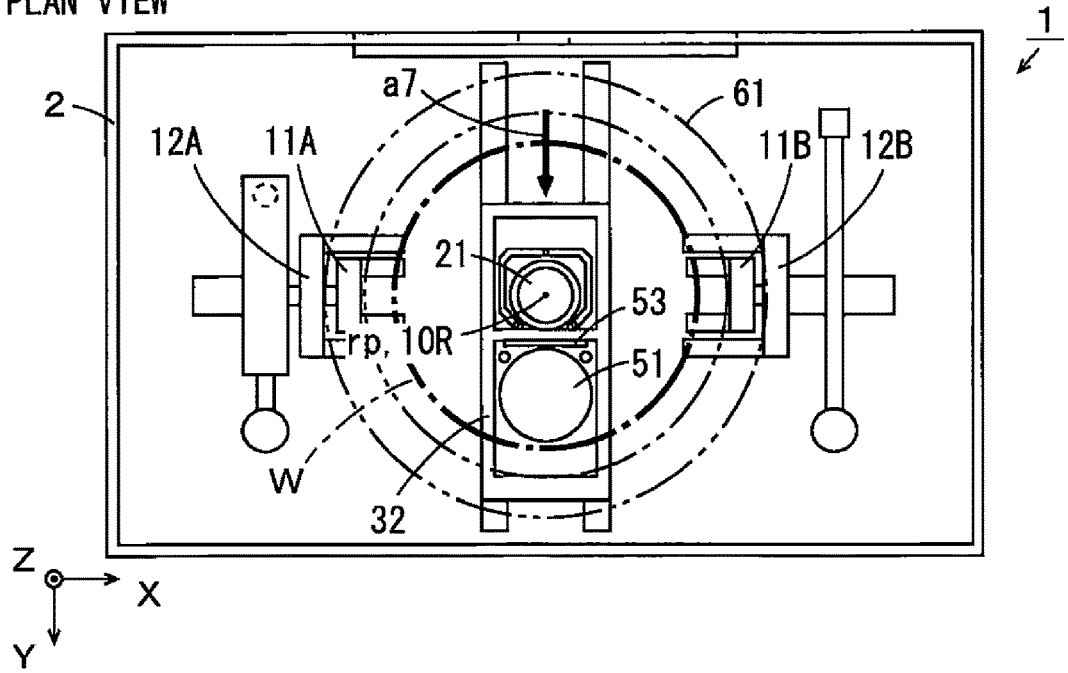
FIG. 8 is a schematic diagram for explaining the schematic operation of the substrate cleaning device of FIG. 1.
Figure 8:
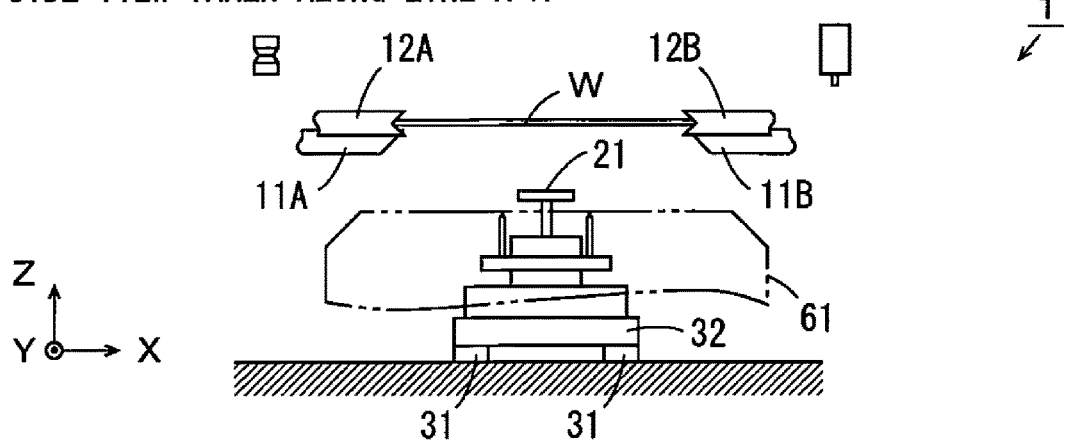
Figure 8:
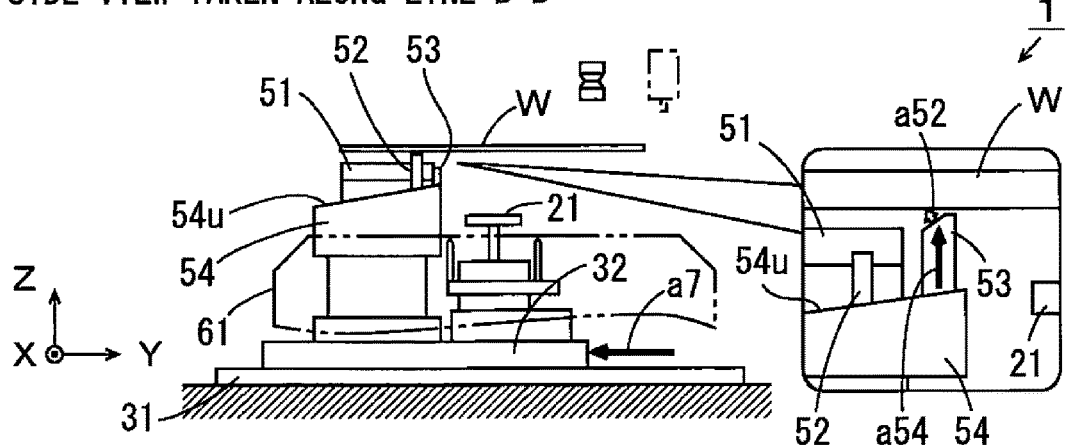

At this time, as indicated by the thick solid arrow a54 in FIG. 8, the gas injector 53 is lifted by the gas lifting-lowering driver 55d of FIG. 3. Thus, the upper end of the gas injector 53 is close to the lower surface of the substrate W as compared to the time when the lower-surface center region of the substrate W is cleaned. The upper end of the gas injector 53 may be located further upwardly than the cleaning surface of the lower-surface brush 51. The height of the upper end of the gas injector 53 at this time is referred to as a second height. In this case, gas is injected toward the substrate W by the gas injector 53 from a second height closer to the lower surface of the substrate W than the first height. In this case, because the lower surface of the substrate W and the upper end of the gas injector 53 are close to each other, the lower surface of the substrate W is efficiently dried.

Thereafter, as indicated by the thick solid arrow a7 in FIG. 8, the mobile base 32 is moved rearwardly such that the suction holder 21 is located at the plane reference position rp. That is, the mobile base 32 is moved from the second horizontal position to the first horizontal position. In this case, the suction holder 21 overlaps with the reference position 10R of the upper holding devices 10A, 10B in a plan view. At this time, injection of gas from the gas injector 53 to the substrate W continues, so that the lower-surface center region of the substrate W is sequentially dried by a gas curtain.

Figure 9:
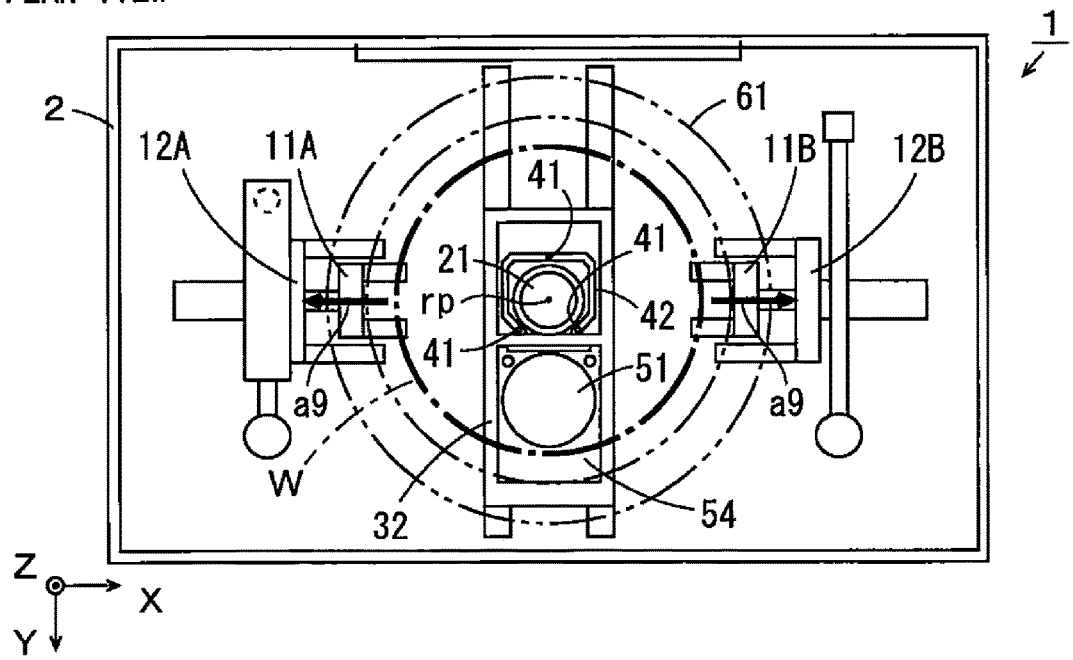
FIG. 9 is a schematic diagram for explaining the schematic operation of the substrate cleaning device of FIG. 1.
Figure 9:
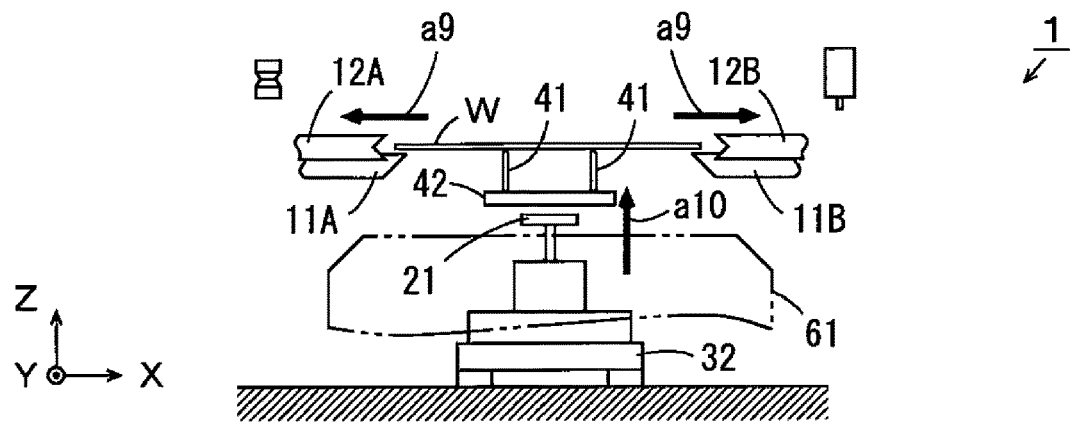
Figure 9:
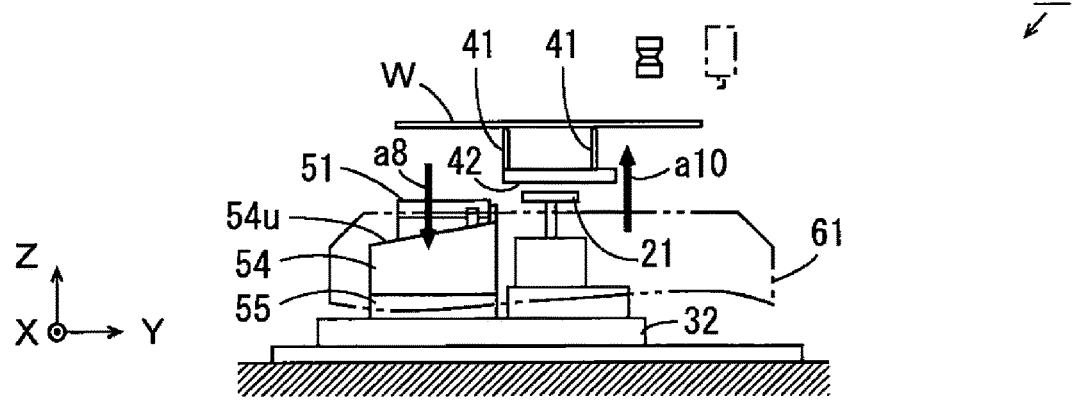

Next, as indicated by the thick solid arrow a8 in FIG. 9, the lifting-lowering supporter 54 is lowered such that the cleaning surface of the lower-surface brush 51 is located at a position farther downward than the suction surface (upper end portion) of the suction holder 21. Further, as indicated by the thick solid arrows a9 in FIG. 9, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 9, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Figure 10:
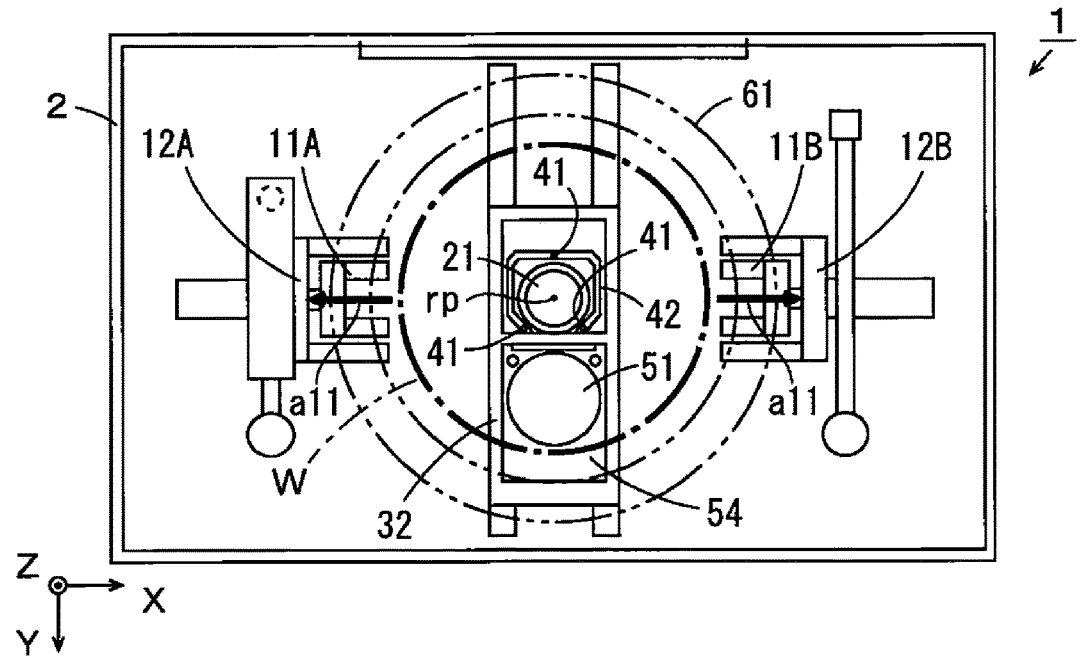
FIG. 10 is a schematic diagram for explaining the schematic operation of the substrate cleaning device of FIG. 1.
Figure 10:
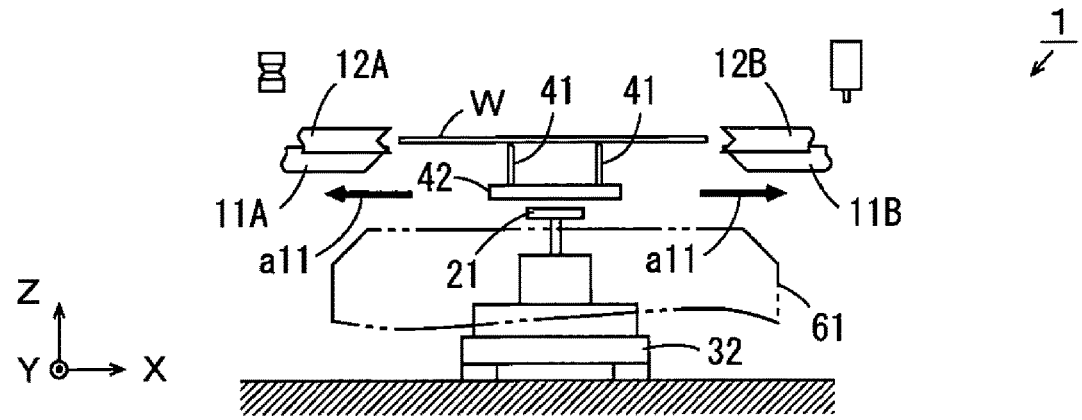
Figure 10:
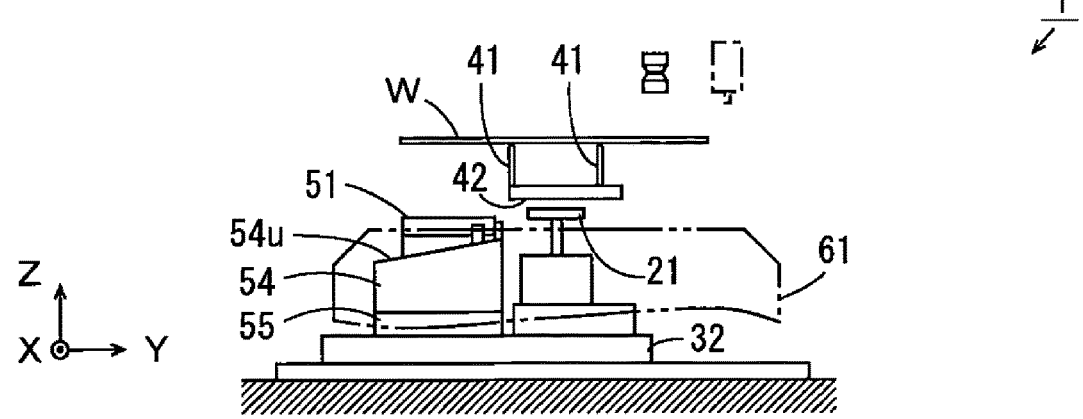

Next, as indicated by the thick solid arrows a11 in FIG. 10, the lower chucks 11A, 11B move away from each other. At this time, the lower chucks 11A, 11B move to positions at which the lower chucks 11A, 11B do not overlap with the substrate W supported by the plurality of support pins 41 in a plan view. Thus, both of the upper holding devices 10A, 10B return to the initial state.

Figure 11:
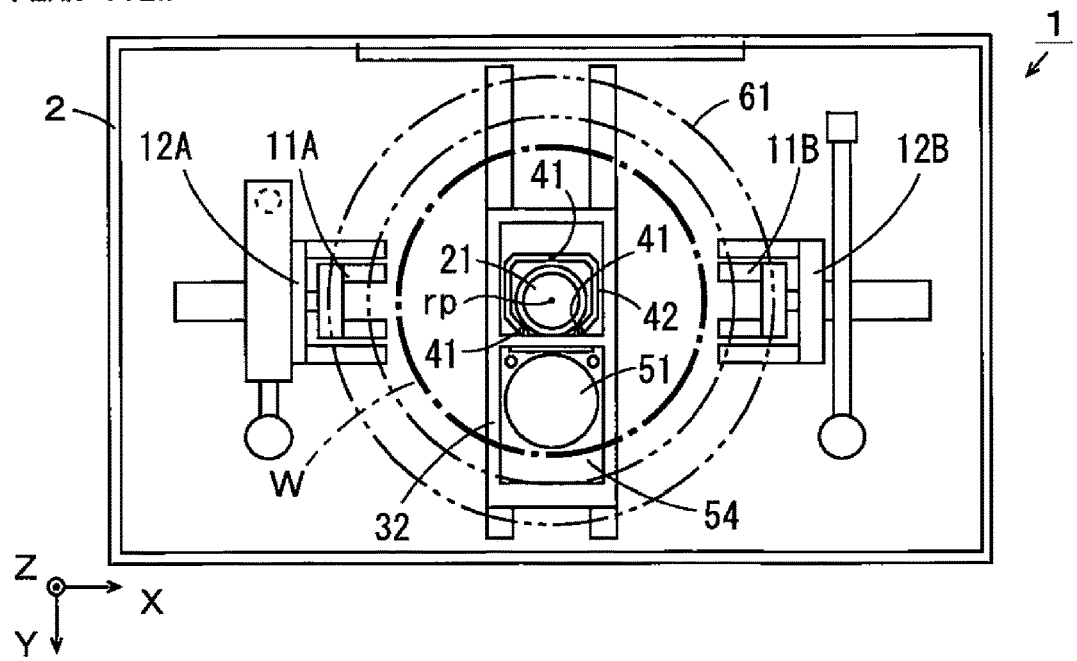
FIG. 11 is a schematic diagram for explaining the schematic operation of the substrate cleaning device of FIG. 1.
Figure 11:
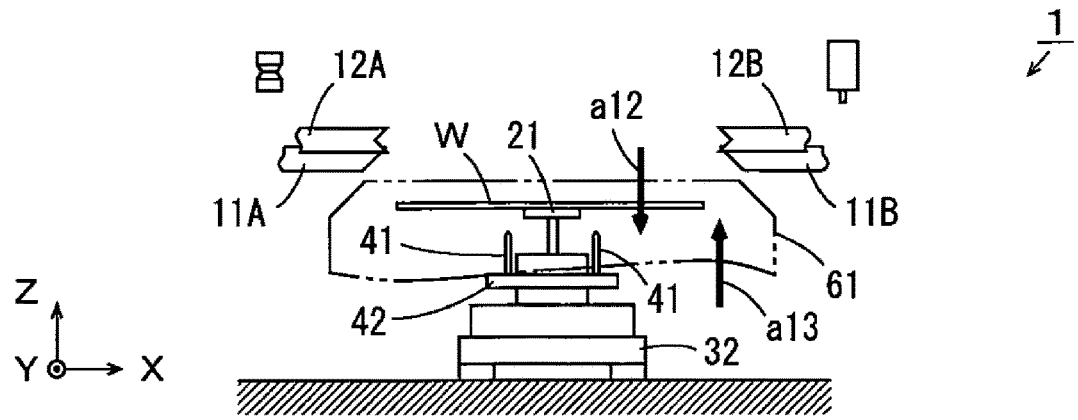
Figure 11:
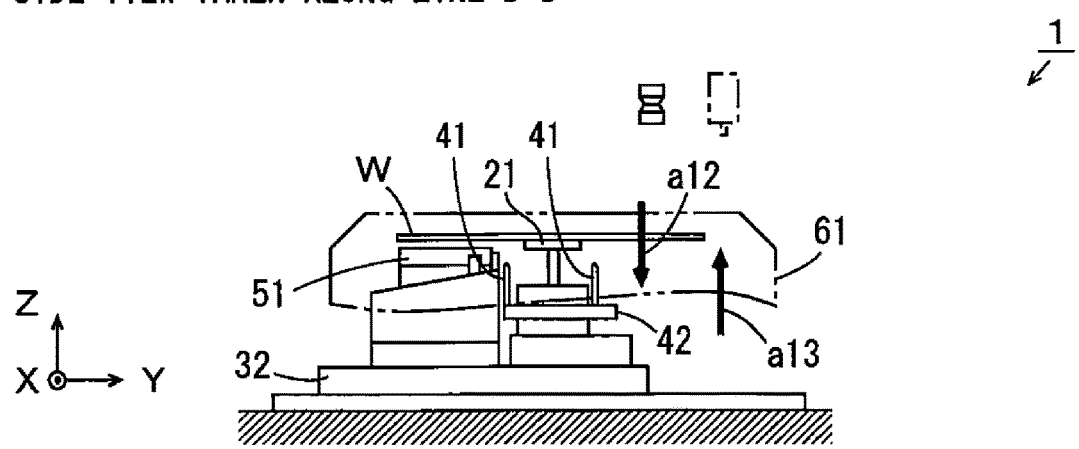

Next, as indicated by the thick solid arrow a12 in FIG. 11, the pin coupling member 42 is lowered such that the upper end portions of the plurality of pins 41 are located at positions farther downward than the suction holder 21. Thus, the substrate W supported on the plurality of support pins 41 is received by the suction holder 21. In this state, the suction holder 21 holds the lower-surface center region of the substrate W by suction. At the same time as the pin coupling member 42 is lowered or after the pin coupling member 42 is lowered, the cup 61 is lifted from the lower cup position to the upper cup position as indicated by the thick solid arrow a13 in FIG. 11.

Figure 12:
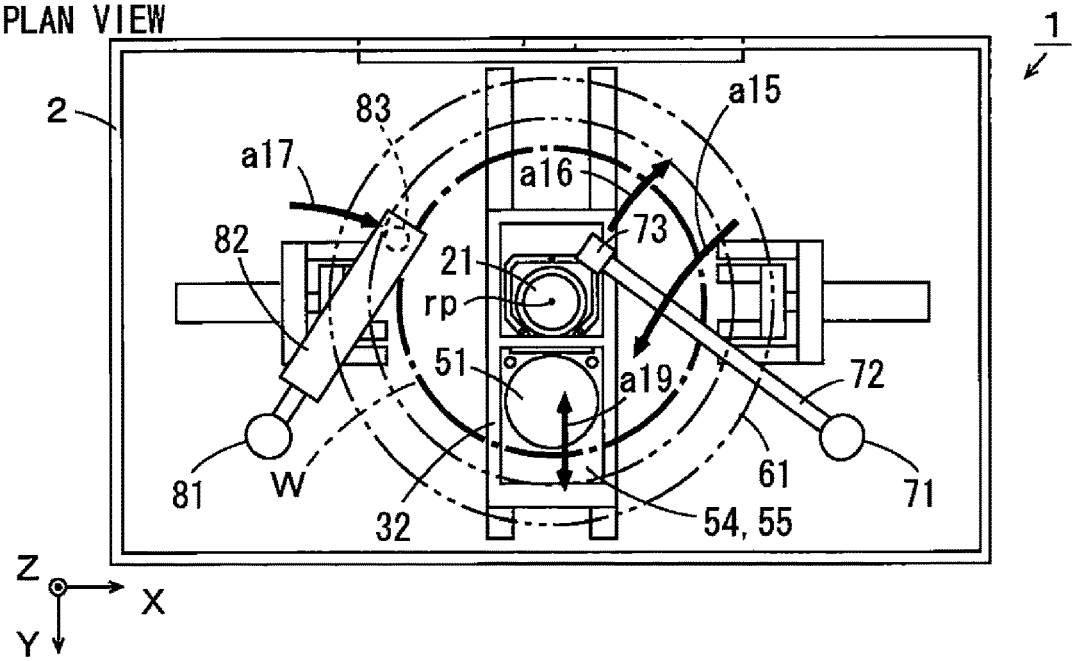
FIG. 12 is a schematic diagram for explaining the schematic operation of the substrate cleaning device of FIG. 1.
Figure 12:
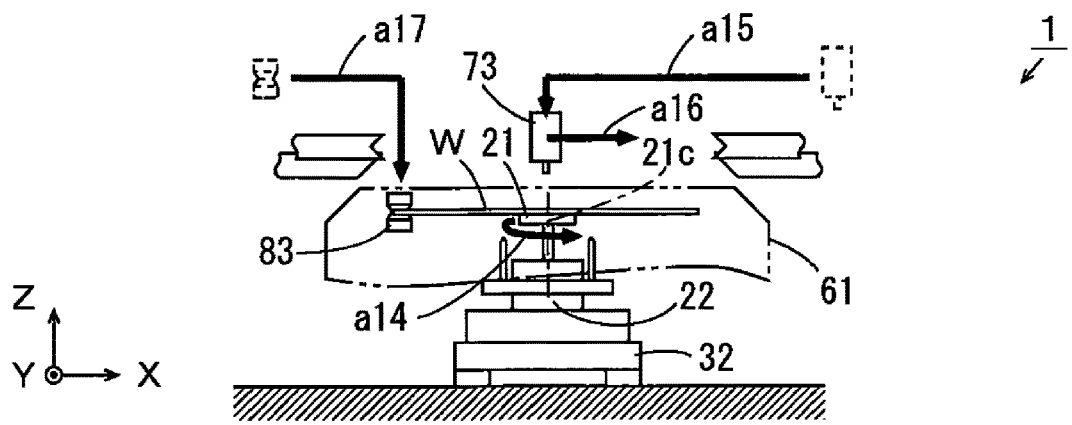
Figure 12:
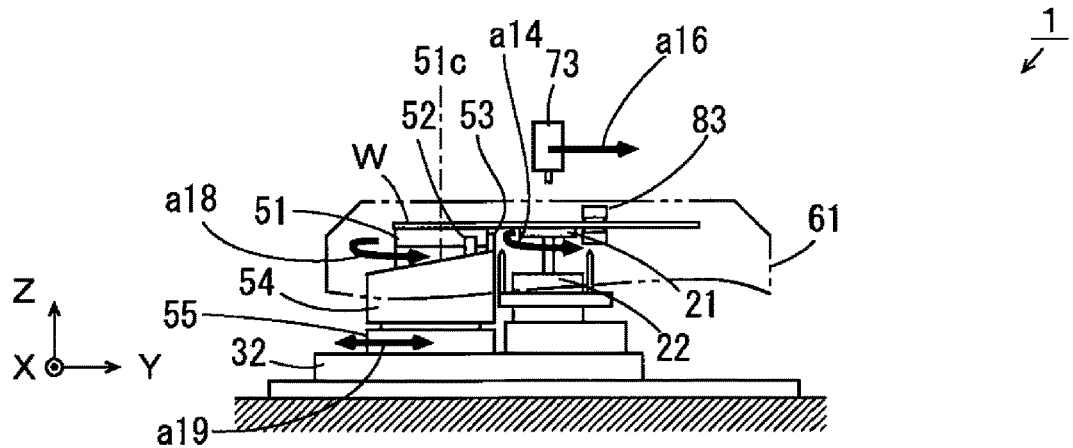

Next, as indicated by the thick solid arrow a14 in FIG. 12, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 12, the spray nozzle 73 is moved to a position above the substrate W, and the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Thus, as indicated by the thick solid arrow a16 in FIG. 12, the spray nozzle 73 is moved at a position above the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 12, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are washed away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 comes into contact with the lower-surface outer region of the substrate W. Further, as indicated by the thick solid arrow a18 in FIG. 12, the lower-surface brush 51 is rotated (spins) about the center axis 51c. Further, the liquid nozzle 52 discharges the cleaning liquid toward the lower surface of the substrate W, and the gas injector 53 injects the gas toward the lower surface of the substrate W. Thus, it is possible to clean the entire lower-surface outer region of the substrate W held by suction and rotated by the suction holder 21 using the lower-surface brush 51.

In a case in which the lower-surface brush 51 is not relatively large, the movement supporter 55 may advance and retreat between the proximal position and the distal position on the mobile base 32 as indicated by the thick solid arrow a19 in FIG. 12. Also in this case, it is possible to clean the entire lower-surface outer region of the substrate W held by suction and rotated by the suction holder 21 using the lower-surface brush 51.

Next, when cleaning of the upper surface, the outer peripheral end and the lower-surface outer region of the substrate W is completed, injection of the fluid mixture from the spray nozzle 73 to the substrate W is stopped. Further, as indicated by the thick solid arrow a20 in FIG. 13, the spray nozzle 73 is moved to a position near one side of the cup 61 (the position of the spray nozzle 73 in the initial state). Further, as indicated by the thick solid arrow a21 in FIG. 13, the bevel brush 83 is moved to a position near the other side of the cup 61 (the position of the bevel brush 83 in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Figure 14:
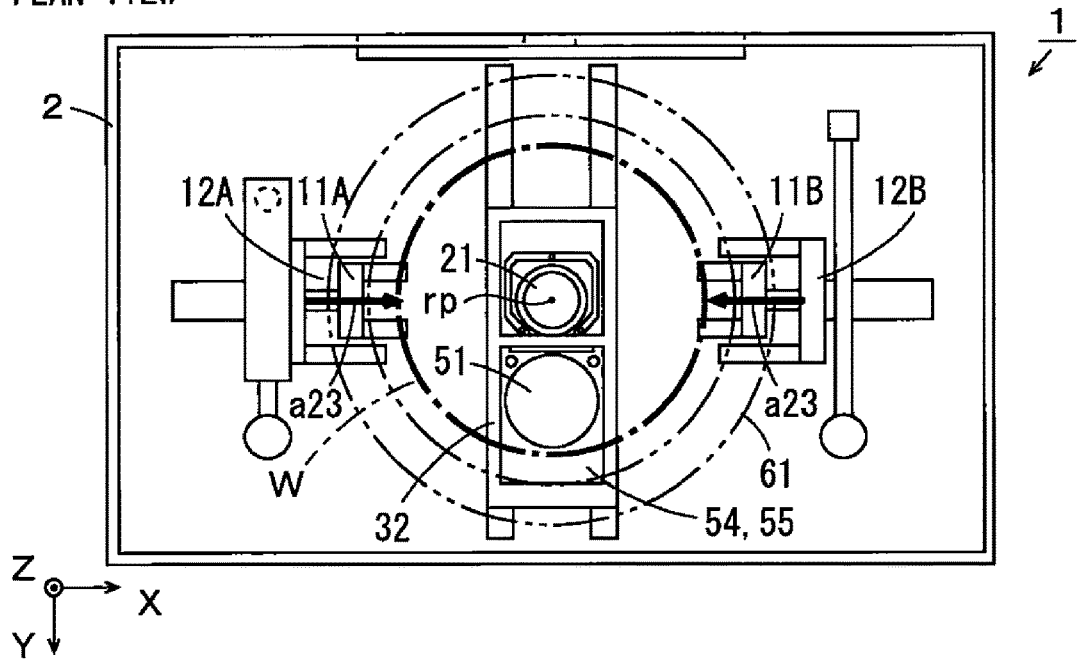
FIG. 14 is a schematic diagram for explaining the schematic operation of the substrate cleaning device of FIG. 1.
Figure 14:
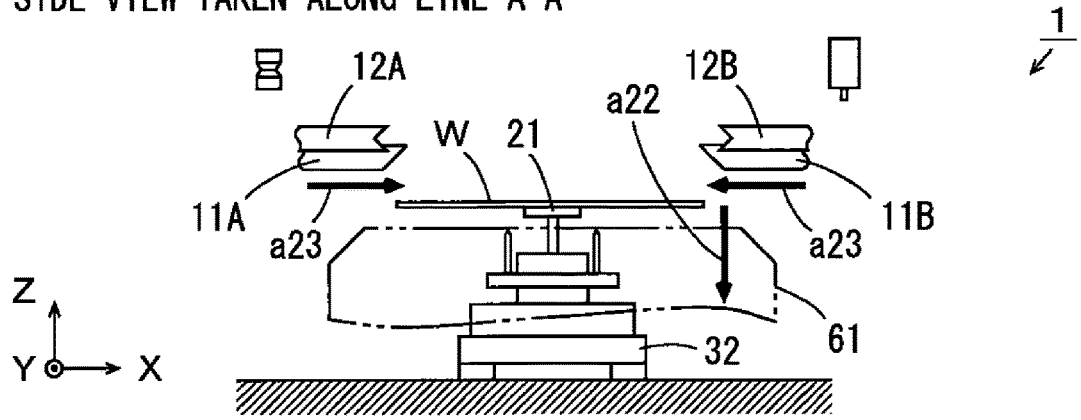
Figure 14:
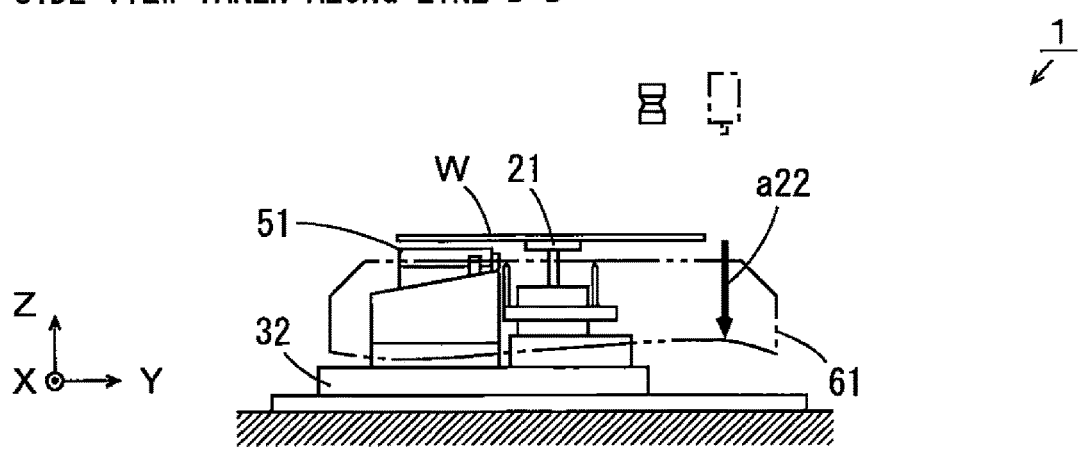
Figure 15:
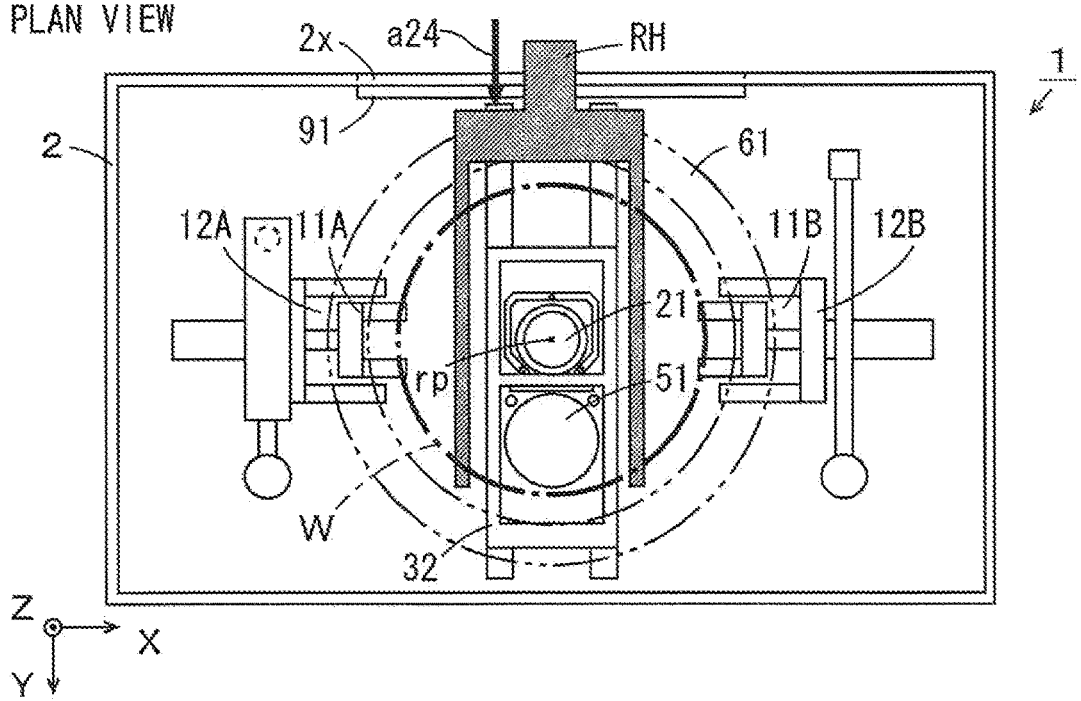
FIG. 15 is a schematic diagram for explaining the schematic operation of the substrate cleaning device of FIG. 1.
Figure 15:
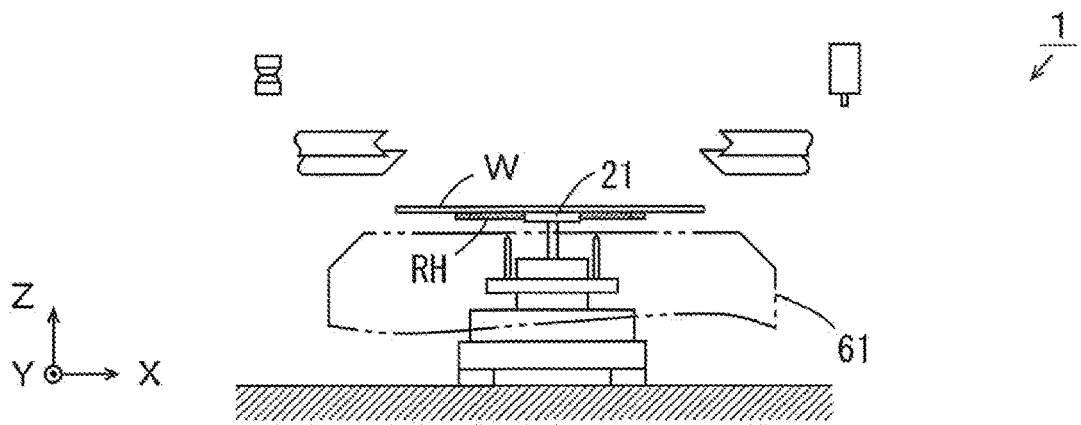
Figure 15:
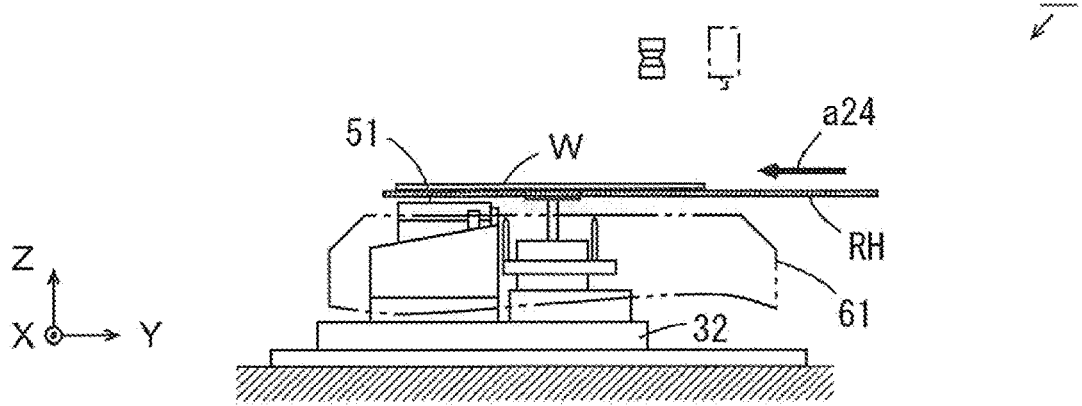

Next, as indicated by the thick solid arrow a22 in FIG. 14, the cup 61 is lowered from the upper cup position to the lower cup position. Further, as indicated by the thick solid arrows a23 in FIG. 14, the lower chucks 11A, 11B move closer to each other to a position at which the lower chucks 11A, 11B can support a new substrate Win preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 15, the hand (substrate holder) RH of the substrate transferring robot (not shown) enters the unit casing 2 through the inlet-outlet port 2x. Subsequently, the hand RH receives the substrate W on the suction holder 21 and exits from the inlet-outlet port 2x. After the hand RH exits, the shutter 91 closes the inlet-outlet port 2x.

(3) Substrate Cleaning Process

Figure 16:
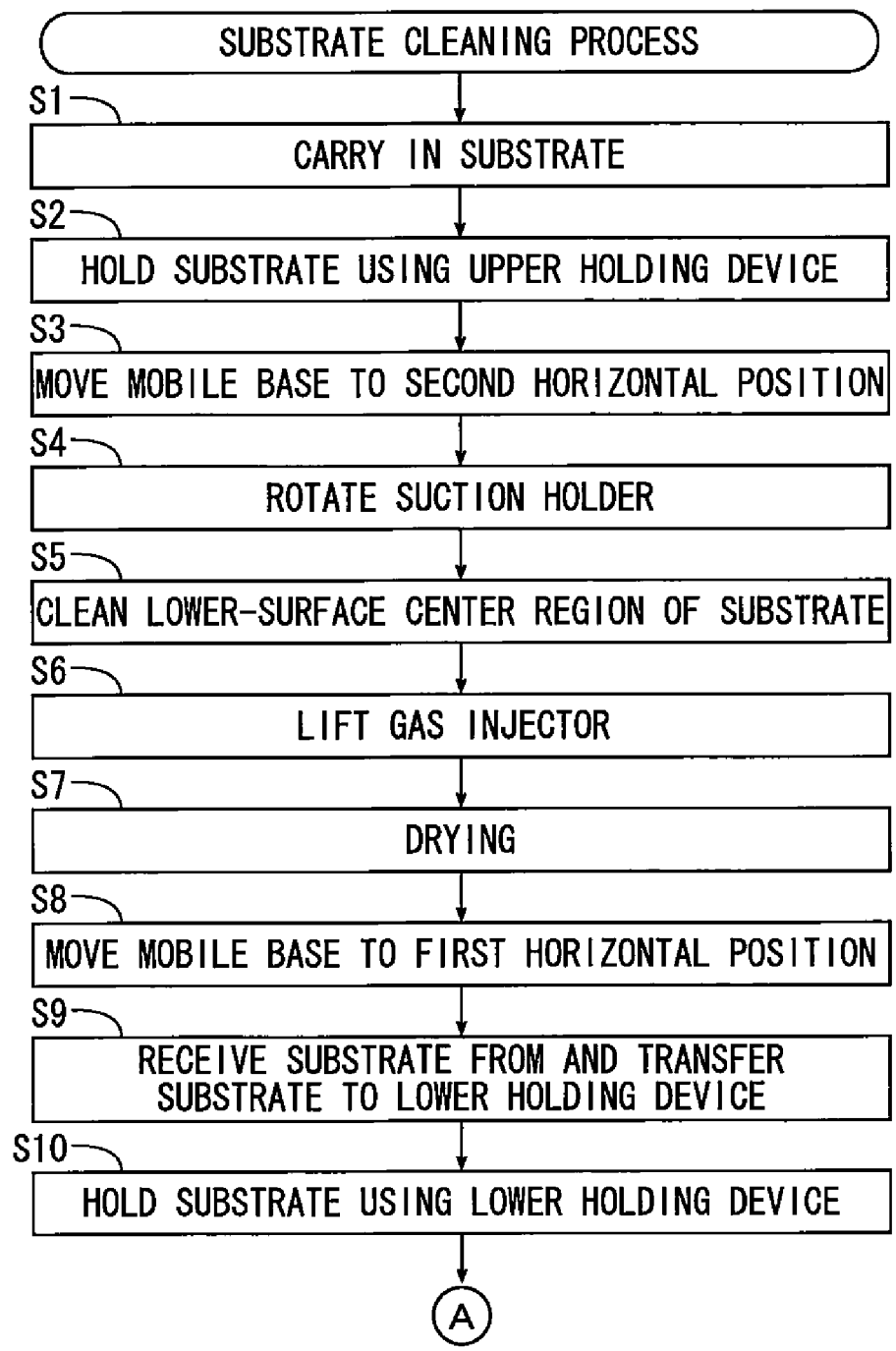
FIG. 16 is a flowchart showing a substrate cleaning process performed by the control device of FIG. 3.
Figure 17:
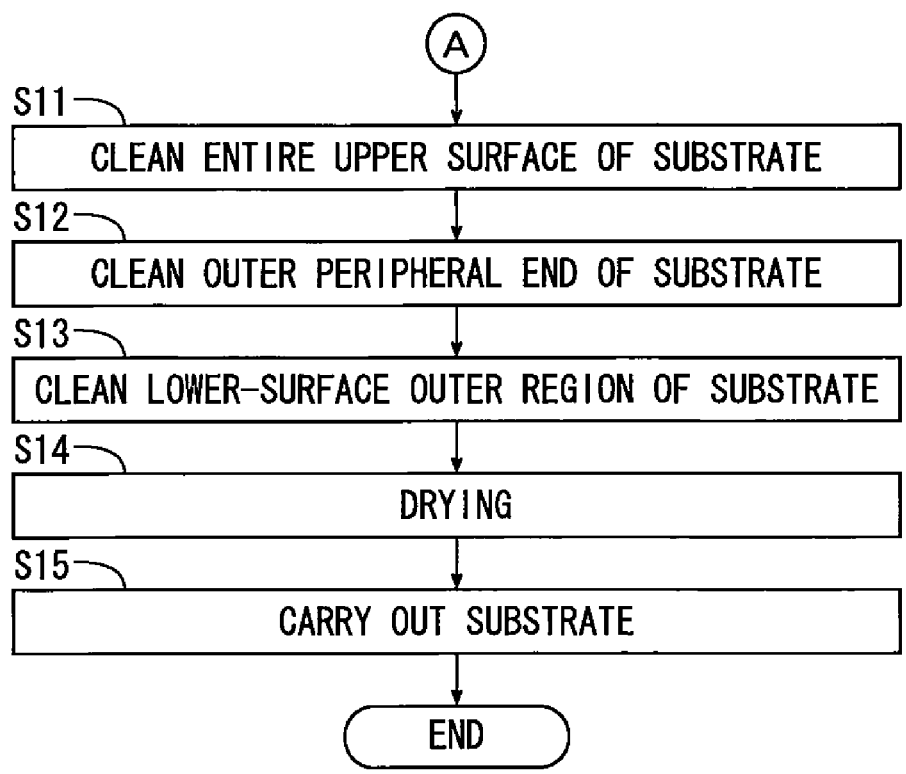
FIG. 17 is a flowchart showing the substrate cleaning process performed by the control device of FIG. 3.

FIGS. 16 and 17 are flowcharts showing a substrate cleaning process performed by the control device 9 of FIG. 3. The substrate cleaning process of FIGS. 16 and 17 is performed by execution of the substrate cleaning program stored in the storage device by the CPU of the control device 9 on the RAM. The substrate cleaning process will be described with reference to the flowcharts of FIGS. 16 and 17, the control device 9 of FIG. 3 and the substrate cleaning device 1 of FIGS. 4 to 15.

Figure 5:
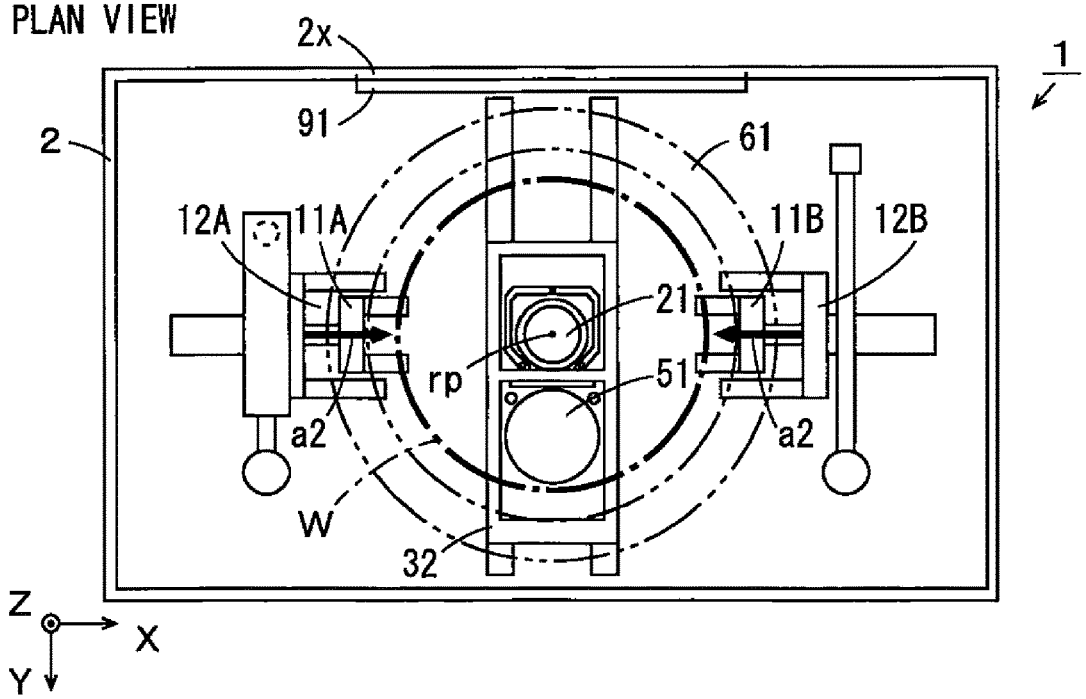
FIG. 5 is a schematic diagram for explaining the schematic operation of the substrate cleaning device of FIG. 1.
Figure 5:
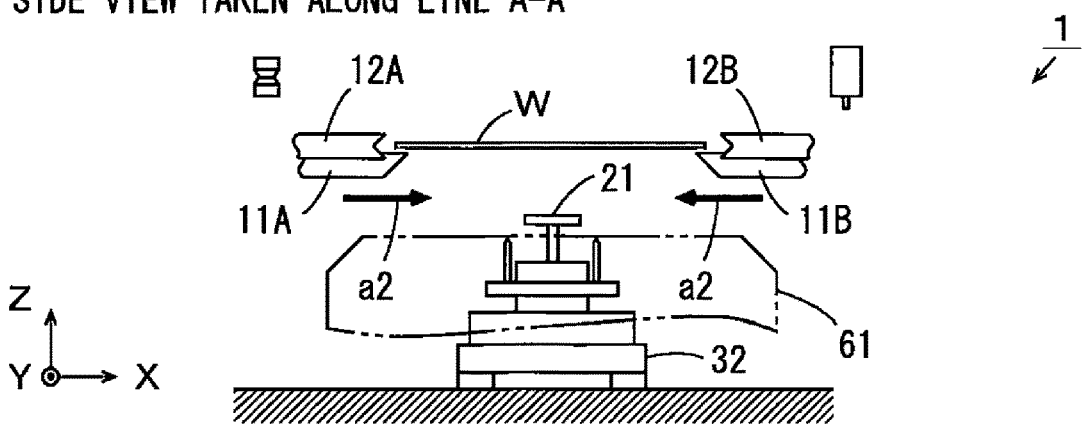
Figure 5:
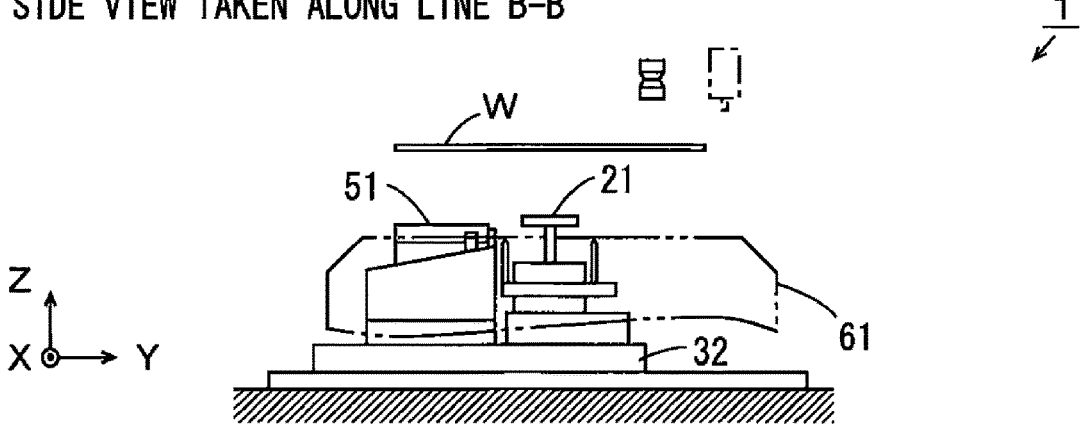

First, the carry-in carry-out controller 9I controls the shutter driver 92, thereby carrying the substrate W into the unit casing 2 (FIGS. 4, 5 and the step S1). Next, the chuck controller 9A controls the lower chuck drivers 13A, 13B and the upper chuck drivers 14A, 14B, thereby holding the substrate W using the upper holding devices 10A, 10B (FIGS. 5 and 6, and the step S2).

Subsequently, the base controller 9C controls the base driver 33, thereby moving the mobile base 32 from the first horizontal position to the second horizontal position (FIG. 6 and the step S3). Thereafter, the suction controller 9B controls the suction holding driver 22 to rotate the suction holder 21 about the axial center of the rotation shaft of the suction holding driver 22 with the suction holder 21 not holding the substrate W (FIG. 7 and the step S4).

Further, the lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 57, thereby cleaning the entire lower-surface center region of the substrate W (FIG. 7 and the step S5). At this time, the upper end of the gas injector 53 is at the first height.

Next, the lower-surface cleaning controller 9E controls the gas lifting-lowering driver 55d, thereby lifting the gas injector 53 (FIG. 8 and the step S6). In this case, the upper end of the gas injector 53 is at the second height. Further, the lower-surface cleaning controller 9E controls the injection gas supplier 57, thereby drying the substrate W (FIG. 8 and the step S7). Further, the base controller 9C controls the base driver 33, thereby moving the mobile base 32 from the second horizontal position to the first horizontal position (FIG. 8 and the step S8). In the present example, the steps S7 and S8 are performed substantially at the same time. Thus, the lower-surface center region of the substrate W is sequentially dried.

Subsequently, the chuck controller 9A controls the lower chuck drivers 13A, 13B and the upper chuck drivers 14A, 14B, and the receiving-transferring controller 9D controls the pin lifting-lowering driver 43, whereby the substrate W is received from the upper holding devices 10A, 10B and transferred to the lower holding device 20 (FIGS. 8 to 11, and the step S9). In this state, the suction controller 9B controls the suction holding driver 22 such that the lower-surface center region of the substrate W is sucked. Thus, the substrate W is held by the lower holding device 20 (FIG. 11 and the step S10).

Thereafter, the upper-surface cleaning controller 9G controls the upper-surface cleaning driver 74 and the upper-surface cleaning fluid supplier 75, thereby cleaning the entire upper surface of the substrate W (FIG. 12 and the step S11). Further, the bevel cleaning controller 9H controls the bevel brush driver 84, thereby cleaning the outer peripheral end of the substrate W (FIG. 12 and the step S12). Further, the lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 57, thereby cleaning the entire lower-surface outer region of the substrate W (FIG. 12 and the step S13).

The steps S11 to S13 are performed substantially at the same time. When the steps S11 to S13 are performed, the suction controller 9B controls the suction holding driver 22, thereby rotating the substrate W about the axial center of the rotation shaft of the suction holding driver 22. Further, the cup controller 9F controls the cup driver 62, thereby lifting the cup 61 from the lower cup position to the upper cup position.

Figure 13:
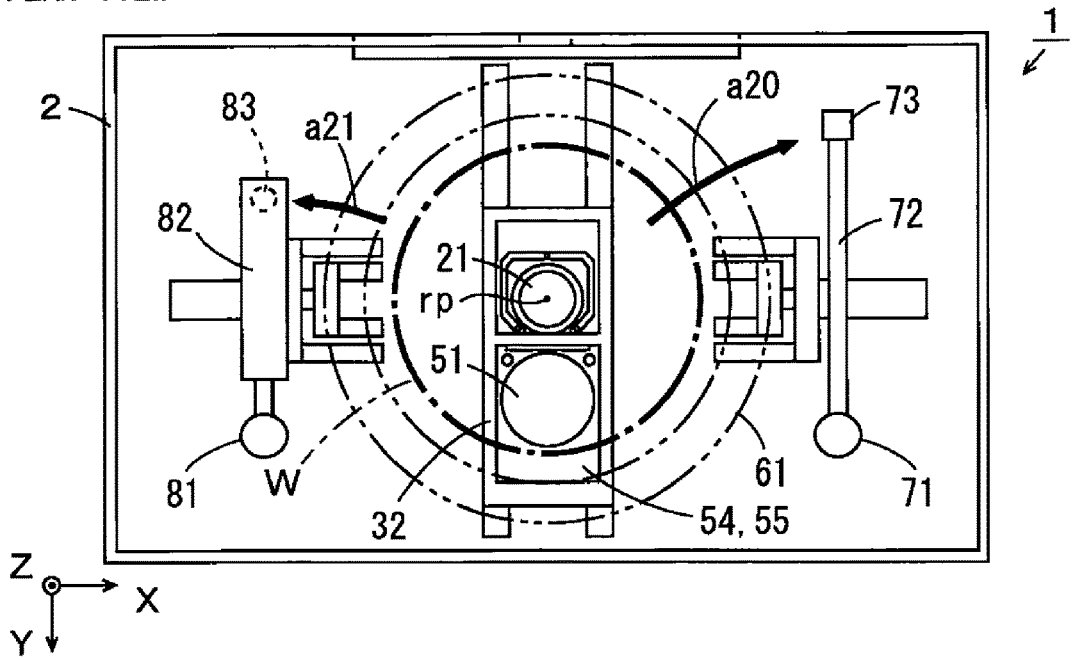
FIG. 13 is a schematic diagram for explaining the schematic operation of the substrate cleaning device of FIG. 1.
Figure 13:
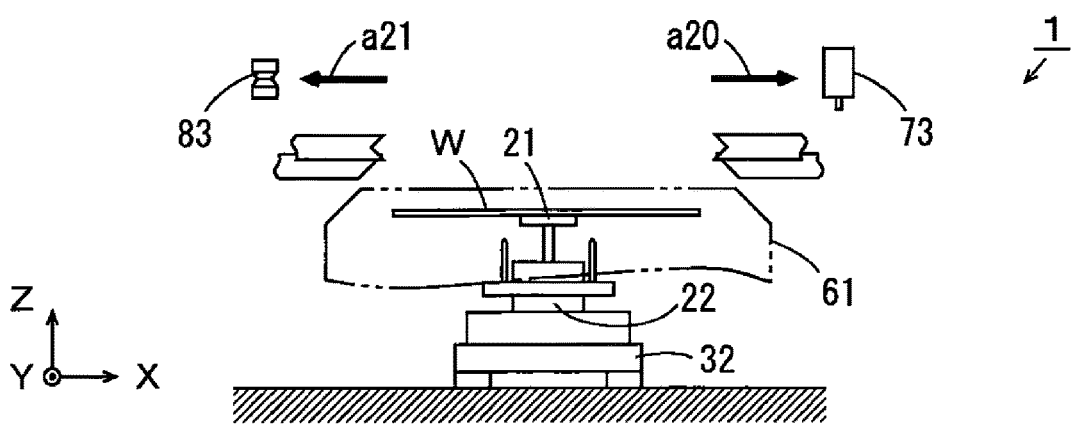
Figure 13:
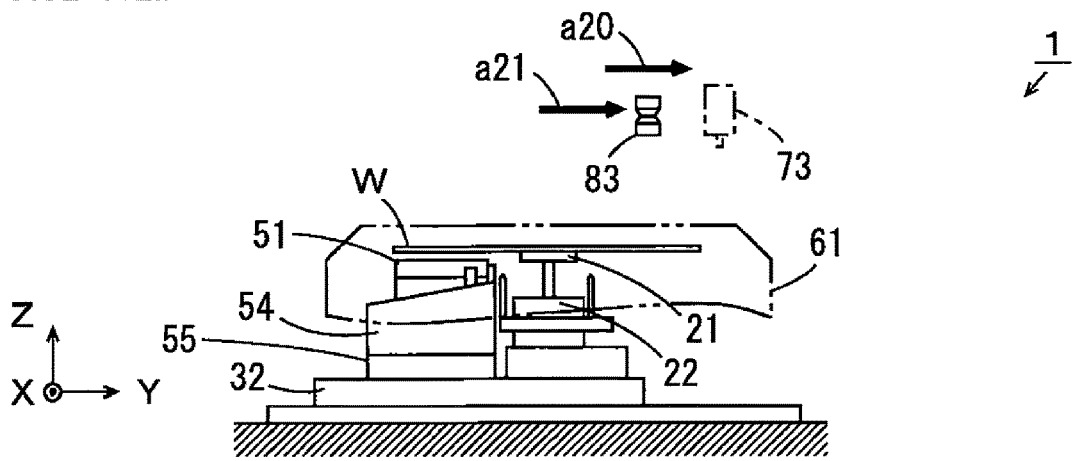

After the cleaning, the suction controller 9B controls the suction holding driver 22 to rotate the suction holder 21 at a high speed, thereby drying the entire substrate W (FIG. 13 and the step S14). After drying, the upper holding devices 10A, 10B, the cup 61 and the like are returned to their initial states (FIG. 14). Finally, the carry-in carry-out controller 9I controls the shutter driver 92, thereby carrying out the substrate W from the unit casing 2 (FIG. 15 and the step S15) and ending the substrate cleaning process.

(4) Effects

In the substrate cleaning device 1 according to the present embodiment, a substrate W is held by the upper holding devices 10A, 10B such that the center of the substrate W is located at the reference position 10R when the lower-surface center region of the substrate W is cleaned. In this state, the lower-surface brush 51 comes into contact with the lower-surface center region of the substrate W. At this time, the suction holder 21 is rotated about the vertical axis while not holding the substrate W. Further, the gas injector 53 arranged between the lower-surface brush 51 and the suction holder 21 injects gas toward the substrate W from the first height spaced apart from the substrate W by a predetermined distance.

When the lower-surface center region of the substrate W is dried, the gas injector 53 injects gas toward the substrate W from the second height closer to the substrate W than the first height. When the lower-surface outer region of the substrate W is cleaned, the lower-surface brush 51 comes into contact with the lower-surface outer region of the substrate W with the substrate W rotated about the vertical axis while the suction holder 21 holds the lower-surface center region of the substrate W. The mobile base 32 moves to the first horizontal position, so that the substrate W can be easily received and transferred between the upper holding devices 10A, 10B and the suction holder 21.

With this configuration, when the lower-surface center region is cleaned, the mobile base 32 moves to the second horizontal position. Thus, the suction holder 21 is retreated to a position not overlapping with the substrate W. Further, a gas curtain is formed between the lower-surface brush 51 and the suction holder 21 by the gas injector 53. In this case, the cleaning liquid including contaminants is prevented from being splashed from the substrate W toward the suction holder 21. Further, when the lower-surface center region is dried, gas is injected from the gas injector 53 to the lower surface of the substrate W with the lower surface of the substrate W and the gas injector 53 being close to each other. Thus, the lower-surface center region is efficiently dried. Therefore, the cleaning liquid is prevented from adhering to the suction holder 21.

Even in a case in which the cleaning liquid that includes contaminants and has splashed from the substrate W adheres to the suction holder 21, the cleaning liquid is shaken off from the suction holder 21 by rotation of the suction holder 21. Thus, the suction holder 21 can be kept clean. Here, in a case in which the rotation speed of the suction holder 21 is equal to or higher than 500 rpm, the cleaning liquid adhering to the suction holder 21 can be shaken off in a short period of time.

The lower-surface brush 51 and the gas injector 53 are supported by the common lifting-lowering supporter 54. In this case, the lower-surface brush 51 and the gas injector 53 are integrally moved in accordance with the position of the substrate W. Thus, the lower surface of the substrate W can be cleaned efficiently. Further, because the gas injector 53 is provided so as to be movable upwardly and downwardly, even in a case in which the lower-surface brush 51 and the gas injector 53 are supported by the common lifting-lowering supporter 54, the gas injector 53 can be brought close to the substrate W when the lower-surface center region of the substrate W is dried as compared to the time when the lower-surface center region of the substrate W is cleaned. Thus, the lower surface of the substrate W can be cleaned efficiently.

(5) Other Embodiments (a) In the above embodiment, the suction holder 21 is rotated while not holding the substrate W when the lower-surface center region of the substrate W is cleaned. Further, gas is injected toward the substrate W by the gas injector 53 from different heights for cleaning and drying of the lower-surface center region of the substrate W. However, the embodiment is not limited to this. In a case in which one of the above-mentioned two operations is performed, the other operation does not have to be performed.

Specifically, in a case in which the suction holder 21 is rotated while not holding the substrate W during cleaning of the lower-surface center region, the gas injector 53 does not have to be lifted and lowered for cleaning and drying of the lower-surface center region. Alternatively, the substrate cleaning device 1 does not have to include the gas injector 53. On the other hand, in a case in which the gas injector 53 is lifted and lowered for cleaning and drying of the lower-surface center region, the suction holder 21 does not have to be rotated while not holding the substrate W during cleaning of the lower-surface center region.

(b) In the above-mentioned embodiment, the lower-surface brush 51 may be cleaned with use of a brush or a sprayer (not shown). The sprayer may be a two-fluid sprayer that supplies liquid and gas. Further, during cleaning of the lower-surface brush 51, gas may be injected by the gas injector 53. In this case, the liquid including contaminants is prevented from being splashed from the lower-surface brush 51 toward the suction holder 21.

Alternatively, the suction holder 21 may be rotated while not holding the substrate W even during cleaning of the lower-surface brush 51. In this case, even in a case in which the liquid that includes contaminants and is splashed from the lower-surface brush 51 adheres to the suction holder 21, the liquid is shaken off from the suction holder 21 by the rotation of the suction holder 21. Thus, the suction holder 21 can be kept clean.

(c) While the lower-surface outer region of a substrate W is cleaned in the lower holding device 20 after the lower-surface center region of the substrate W is cleaned in the upper holding devices 10A, 10B in the above-mentioned embodiment, the embodiment is not limited to this. The lower-surface center region of the substrate W may be cleaned in the upper holding devices 10A, 10B after the lower-surface outer region of the substrate W is cleaned in the lower holding device 20.

(d) While the lower-surface brush 51 and the gas injector 53 are supported by the common lifting-lowering supporter 54 in the above-mentioned embodiment, the embodiment is not limited to this. The lower-surface brush 51 and the gas injector 53 may be supported by separate supporters. While the suction holder 21, the lower-surface brush 51 and the gas injector 53 are provided at the mobile base 32, the embodiment is not limited to this. The suction holder 21, the lower-surface brush 51 and the gas injector 53 do not have to be provided at the mobile base 32.

(e) While the mobile base 32 moves linearly in a horizontal plane in the above-mentioned embodiment, the embodiment is not limited to this. The mobile base 32 may move in a curved manner in a horizontal plane.

(f) While the substrate cleaning device 1 includes the receiving-transferring device 40 for receiving and transferring a substrate W between the upper holding devices 10A, 10B and the lower holding device 20 in the above-mentioned embodiment, the embodiment is not limited to this. In a case in which the upper holding devices 10A, 10B and the lower holding device 20 are configured to be able to directly receive and transfer a substrate W, the substrate cleaning device 1 does not have to include the receiving-transferring device 40.

(g) While the upper surface and the outer peripheral end of the substrate W are cleaned in the above-mentioned embodiment, the embodiment is not limited to this. The upper surface of the substrate W does not have to be cleaned. In this case, the substrate cleaning device 1 does not include the upper-surface cleaning device 70. Similarly, the outer peripheral end of a substrate W does not have to be cleaned. In this case, the substrate cleaning device 1 does not include the end-portion cleaning device 80.

(h) While the substrate cleaning device 1 includes the control device 9 in the above-mentioned embodiment, the embodiment is not limited to this. In a case in which being configured to be controllable by an external information processing apparatus, the substrate cleaning device 1 does not have to include the control device 9.

(6) Correspondence Relationship Between Respective Components of Claims and Respective Portions of Embodiments In the following paragraphs, non-limiting examples of correspondences between various elements recited in the claims below and those described above with respect to various preferred embodiments of the present invention are explained. As each of constituent elements recited in the claims, various other elements having configurations or functions described in the claims can be also used.

In the above-mentioned embodiment, the reference position 10R is an example of a reference position, the substrate W is an example of a substrate, the upper holding devices 10A, 10B and the suction holder 21 are respectively examples of first and second holders, and the lower-surface brush 51 is an example of a cleaner. The mobile base 32 is an example of a mobile base, the substrate cleaning device 1 is an example of a substrate cleaning device, the linear guide 31 is an example of a linear guide, the gas injector 53 is an example of a gas injector, and the lifting-lowering supporter 54 is an example of a supporter.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate cleaning device comprising:
a first holder that has a reference position and holds a substrate such that a center of the substrate is located at the reference position;
a second holder that is configured to be rotatable about a vertical axis and holds a lower-surface center region of the substrate;
a cleaner that cleans the lower-surface center region by coming into contact with the lower-surface center region of the substrate held by the first holder and cleans a lower-surface outer region by coming into contact with the lower-surface outer region surrounding the lower-surface center region of the substrate rotated by the second holder; and
a mobile base that is provided with the second holder and the cleaner, moves in a horizontal plane such that the second holder overlaps with the reference position of the first holder in a plan view when the substrate is received and transferred between the first holder and the second holder, and moves in a horizontal plane such that the cleaner overlaps with the reference position of the first holder in the plan view when the lower-surface center region is cleaned, wherein
the second holder moves in the horizontal plane together with the mobile base, and
the second holder rotates while not holding the substrate during cleaning of the lower-surface center region.

2. The substrate cleaning device according to claim 1, further comprising a gas injector that is arranged between the cleaner and the second holder and injects gas toward the substrate.

3. The substrate cleaning device according to claim 1, further comprising a linear guide that extends in one direction in the horizontal plane, wherein
the mobile base moves linearly along the linear guide.

4. The substrate cleaning device according to claim 1, wherein
a rotation speed of the second holder during cleaning of the lower-surface center region is equal to or higher than 500 rpm.

5. A substrate cleaning device comprising:
a first holder that has a reference position, and holds a substrate such that a center of the substrate is located at the reference position;
a second holder that has a first center axis extending in an up-and-down direction and rotates the substrate about the first center axis while holding a lower-surface center region of the substrate;
a cleaner that has a second center axis extending in the up-and-down direction, cleans the lower-surface center region while rotating about the second center axis while being in contact with the lower-surface center region of the substrate held by the first holder and cleans a lower-surface outer region by coming into contact with the lower-surface outer region surrounding the lower-surface center region of the substrate rotated by the second holder; and
a mobile base that is provided with the second holder and the cleaner, moves in a horizontal plane such that the reference position of the first holder and the first center axis of the second holder coincide with each other in a plan view when the substrate is received and transferred between the first holder and the second holder, and moves in the horizontal plane such that the cleaner overlaps with the lower-surface center region of the substrate held by the first holder and the second center axis of the cleaner coincides with a first portion different from a center of the substrate in the plan view when the lower-surface center region is cleaned,
wherein the second holder and the cleaner are mounted to the mobile base such that the second holder and the cleaner are movable in the horizontal plane together with the mobile base, and
the second holder rotates while not holding the substrate during cleaning of the lower-surface center region.

* * * * *